United States Patent
Tanaka et al.

(10) Patent No.: US 8,283,747 B2
(45) Date of Patent: Oct. 9, 2012

(54) SEMICONDUCTOR DEVICE AND FABRICATION METHOD OF THE SAME

(75) Inventors: Hiroyuki Tanaka, Tokyo (JP); Takeshi Shimizu, Tokyo (JP); Koji Yuki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 104 days.

(21) Appl. No.: 12/461,592

(22) Filed: Aug. 17, 2009

(65) Prior Publication Data

US 2010/0052091 A1 Mar. 4, 2010

(30) Foreign Application Priority Data

Aug. 20, 2008 (JP) ................................. 2008-211937

(51) Int. Cl.
*H01L 29/06* (2006.01)
(52) U.S. Cl. ................. 257/500; 257/E21.545
(58) Field of Classification Search .................. 257/544, 257/93, 446, E21.545, E21.544, E21.557, 257/E21.551, E21.558
See application file for complete search history.

(56) References Cited

U.S. PATENT DOCUMENTS

| | | | |
|---|---|---|---|
| 2003/0071314 A1* | 4/2003 | Jang et al. | 257/371 |
| 2006/0157818 A1* | 7/2006 | Williams et al. | 257/511 |
| 2007/0145408 A1* | 6/2007 | Menard | 257/107 |

FOREIGN PATENT DOCUMENTS

JP 05-299498 A 11/1993

* cited by examiner

*Primary Examiner* — Victor A Mandala
*Assistant Examiner* — Selim Ahmed
(74) *Attorney, Agent, or Firm* — Rabin & Berdo, P.C.

(57) ABSTRACT

A semiconductor device including a first conduction type semiconductor layer; a second conduction type element forming region formed above the first conduction type semiconductor layer and formed with at least one semiconductor element formed on a surface region of the second conduction type element forming region; a first conduction type element-isolation region insulating and segregating the second conduction type element forming region from the exterior; and a second conduction type buried region formed at the interface of the first conduction type semiconductor layer and the second conduction type element forming region, formed separated from the first conduction type element-isolation region. In the semiconductor device a second conduction type high concentration region is buried in the surface of the second conduction type element forming region and formed to surround the semiconductor element and separated from the first conduction type element-isolation region.

11 Claims, 16 Drawing Sheets

SEMICONDUCTOR DEVICE AND FABRICATION METHOD OF THE SAME

CROSS-REFERENCE TO RELATED APPLICATION

This application claims priority under 35 USC 119 from Japanese Patent Application No. 2008-211937 filed on Aug. 20, 2008, the disclosure of which is incorporated by reference herein.

BACKGROUND

1. Technical Field

The present invention relates to a semiconductor device and to a fabrication method thereof, and in particular to a semiconductor device with a high element-isolation breakdown voltage in impurity element-isolation regions, and to a fabrication method of the same.

2. Related Art

Along with developments in making electrical devices more compact and lowering their cost, there is also demand for more compactness in power transistors for installation in such electrical devices. In particular, technology for integrating a control circuit and plural power transistors (semiconductor elements) onto the same semiconductor substrate is essential in electrical devices that are subject to demands for even more compactness, such as mobile devices and household devices. When forming plural semiconductor elements on the same semiconductor substrate, methods exist for element-isolation between semiconductor elements by use of impurity element-isolation regions.

Apart from the above demands for more compactness and higher integration, there are also demands for higher breakdown voltages of semiconductor devices. Greater currents can be used for driving semiconductor devices accommodating such high breakdown voltages. Such semiconductor devices can prevent various current leaks and avoid latching up. For example, the breakdown voltage required in semiconductor devices is of the order of a few V for microcomputer, DRAM, and memory use, of the order of a few tens of V for LCD driver use, and of the order of several hundreds of V for high voltage display use.

An example of a high breakdown voltage electric field effect transistor (HVMOS: High Voltage Metal-Oxide-Semiconductor) will now be explained, with reference to FIG. 1.

As shown in FIG. 1, an HVMOS 200 is configured with a P-type silicon substrate 201, an N-type epitaxial layer 202 formed above the P-type silicon substrate 201, an N-type buried layer 203 selectively formed at the interface of the P-type silicon substrate 201 and the N-type epitaxial layer 202, an inter-layer insulating layer 204 formed above the N-type epitaxial layer 202, and a metal wiring layer 205 formed above the inter-layer insulating layer 204.

A P-type drift layer 206, a P-type high concentration region 207 (referred to below as P⁺ region), and a field oxide film 208 are formed on the N-type epitaxial layer 202. A gate oxidized film 209, and a gate electrode 210 that is made from polycrystalline silicon, are formed above the N-type epitaxial layer 202. A P-type isolation region 211 electrically connected to the P-type silicon substrate 201 is formed in the N-type epitaxial layer 202. An element region of the HVMOS 200 is element-isolated by the P-type isolation region 211. The P⁺ region 207 is connected to the metal wiring layer 205 via a contact line 212 that penetrates through the inter-layer insulating layer 204.

The HVMOS 200 configured as described above can accommodate high breakdown voltages due to the N-type buried layer 203 formed at the interface of the P-type silicon substrate 201 and the N-type epitaxial layer 202. A reason for this is that the resistance value of the N-type region formed by the N-type epitaxial layer 202 and the N-type buried layer 203 is lower than the resistance value of the N-type epitaxial layer 202 alone, and so resistance to latch-up of the HVMOS 200 is raised. In addition, since isolation of the P-type silicon substrate 201 from the N-type epitaxial layer 202 is ensured by the N-type buried layer 203, leak current from the P-type silicon substrate 201 to the N-type epitaxial layer 202 is prevented from occurring, and robustness to noise can be raised.

In an HVMOS 200 such as that shown in FIG. 1, the isolation breakdown voltage between adjacent element regions is determined by the PN junction between the P-type isolation region 211 and the N-type epitaxial layer 202. If the isolation breakdown voltage between adjacent element regions is lower than the operating voltage of the HVMOS 200, then when the operating voltage is applied to a given metal line 205, a leak current occurs from the N-type epitaxial layer 202 of a semiconductor element that includes the metal wiring layer 205 to which the operating voltage has been applied, through the P-type isolation region 211, to the N-type epitaxial layer 202 of an adjacent semiconductor element. The HVMOS 200 can no longer be operated correctly when such a leak current occurs.

In Japanese Patent Application Laid-Open (JP-A) No. 5-299498 a semiconductor device is described that can achieve suppression of leak current and stronger latch-up resistance without the provision of a buried layer as described above. In the semiconductor device described in JP-A No. 5-299498, by provision of a channel stopper region in a silicon substrate bottom face, and by having a trench buried insulating film penetrating to the channel stopper region through the silicon substrate and through an impurity well region, suppression of leak current and stronger latch-up resistance can be achieved.

However, in the HVMOS 200 shown in FIG. 1, if an even higher breakdown voltage is required then there is the problem that sufficiently a high breakdown voltage cannot be achieved in practice.

The present invention is made in consideration of the above circumstances, and provides a semiconductor device with a buried layer formed at a semiconductor substrate and epitaxial layer interface, the semiconductor device enabling sufficiently higher breakdown voltage to be achieved. A fabrication method of the same is also provided.

SUMMARY

The present invention has been made in view of the above circumstance and provides a semiconductor device.

The present invention provides a semiconductor device including: a first conduction type semiconductor layer; a second conduction type element forming region formed above the first conduction type semiconductor layer and formed with at least one semiconductor element formed on a surface region of the second conduction type element forming region; a first conduction type element-isolation region that segregates the second conduction type element forming region; a second conduction type buried region formed at the interface of the first conduction type semiconductor layer and the second conduction type element forming region, separated from the first conduction type element-isolation region; and a second conduction type high concentration region buried in a surface of the second conduction type element forming region and also formed to surround the semiconductor element and separated from the first conduction type element-isolation region.

The present invention provides a semiconductor device on which a plurality of element regions for forming semiconductor elements are consolidated so as to be electrically isolated from each other by a first conduction type element-isolation region, wherein: each of the element regions includes a first conduction type semiconductor layer, a second conduction type element forming region, and a second conduction type buried layer interposed between the first conduction type semiconductor layer and the second conduction type element forming region; and in the second conduction type element forming region, by forming a second conduction type high concentration region buried in the surface of the second conduction type element forming region so as to be separated from the first conduction type element-isolation region and so as to surround the semiconductor element, adjacent element regions have a higher isolation breakdown voltage in comparison to a case where the second conduction type high concentration region is not provided.

The semiconductor device according to the present invention, as well as burying a second conduction type high concentration region in the surface of a second conduction type element forming layer formed on a first conduction type semiconductor substrate, also has the second conduction type high concentration region surrounding the semiconductor elements formed on the surface of the second conduction type element forming layer and being separated from the first conduction type element-isolation region for segregating the semiconductor elements. The isolation breakdown voltage between the adjacent element regions can thereby be increased to a high breakdown voltage.

Another aspect of the present invention provides a semiconductor device fabrication method including:

a preparation process of preparing a first conduction type semiconductor substrate;

a buried layer forming process of forming a second conduction type buried layer including a non-continuous portion on the surface of the first conduction type semiconductor substrate;

an element layer forming process of forming a second conduction type element forming layer above the first conduction type semiconductor substrate and the second conduction type buried layer;

a high concentration region forming process of forming a second conduction type high concentration region in a surface region of the second conduction type element forming layer, the second conduction type high concentration region having an impurity concentration higher than that of the second conduction type element forming layer;

an element-isolation region forming process of forming a first conduction type element-isolation region above the non-continuous portion in the second conduction type buried layer and separated from the second conduction type high concentration region; and an element forming process of forming a semiconductor element in the surface region of the second conduction type element forming layer in a region surrounded by the second conduction type high concentration region.

In the element-isolation region forming process, the first conduction type element-isolation region may be formed such that the outside end portion of the second conduction type high concentration region faces a region between the second conduction type buried layer and the first conduction type element-isolation region.

In the element-isolation region forming process, the first conduction type element-isolation region may be formed such that the separation distance from the first conduction type element-isolation region to the second conduction type high concentration region is 20% to 60% of the separation distance from the first conduction type element-isolation region to the second conduction type buried layer.

In the element-isolation region forming process, the first conduction type element-isolation region may be formed such that the separation distance from the first conduction type element-isolation region to the second conduction type high concentration region is 30% to 40% of the separation distance from the first conduction type element-isolation region to the second conduction type buried layer.

In the high concentration region forming process, the second conduction type high concentration region may be formed such that the second conduction type buried layer and at least one portion of the second conduction type high concentration region face each other.

The high concentration region forming process may further comprise forming an element-isolation insulation film on the second conduction type high concentration region by thermal processing.

BRIEF DESCRIPTION OF THE DRAWINGS

Exemplary embodiments of the present invention will be described in detail based on the following figures, wherein.

DETAILED DESCRIPTION

Explanation will now be given of details of an exemplary embodiment of the present invention, with reference to the accompanying drawings.

First, explanation will be given regarding the structure of a semiconductor device that is an exemplary embodiment of the present invention, with reference to FIG. 2 and FIG. 5.

Figure 1:
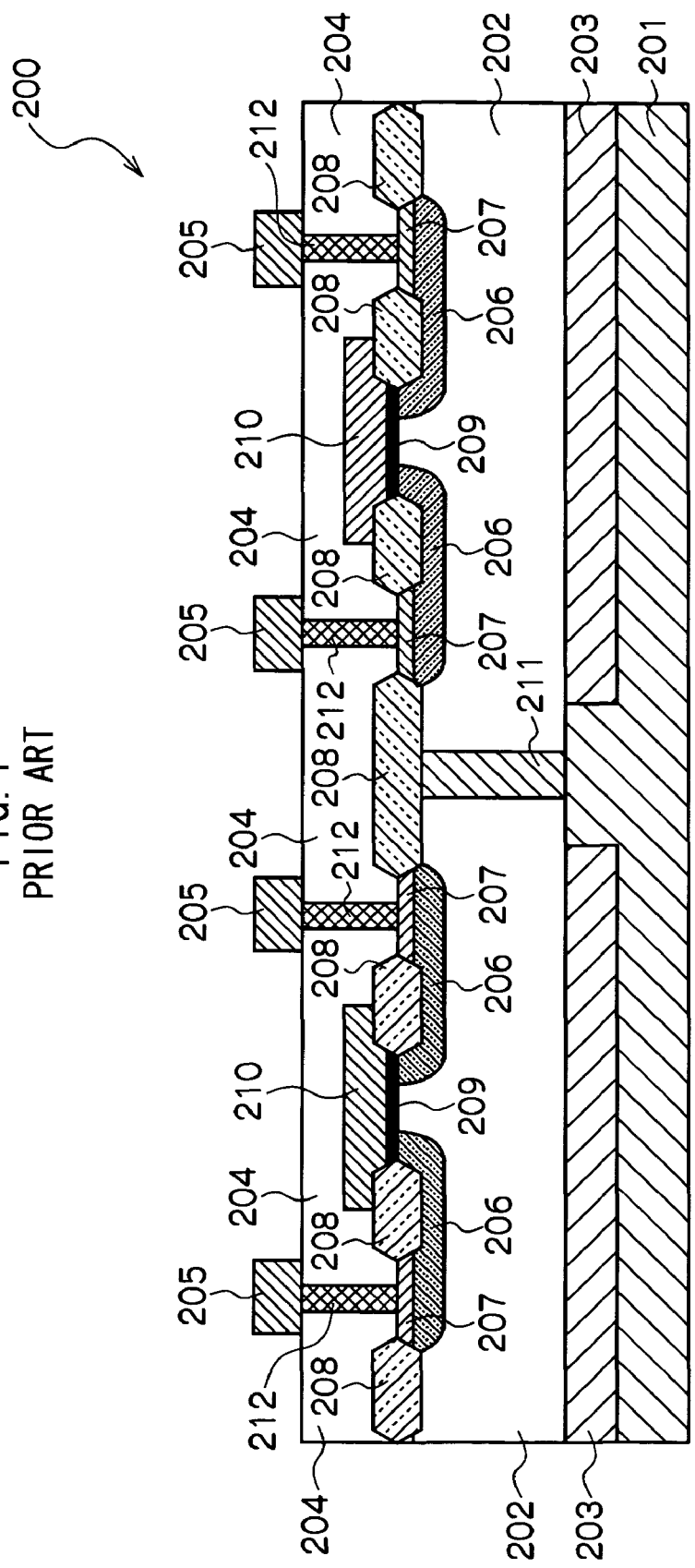
FIG. 1 is a cross-section of portions of a related semiconductor device.
Figure 2:
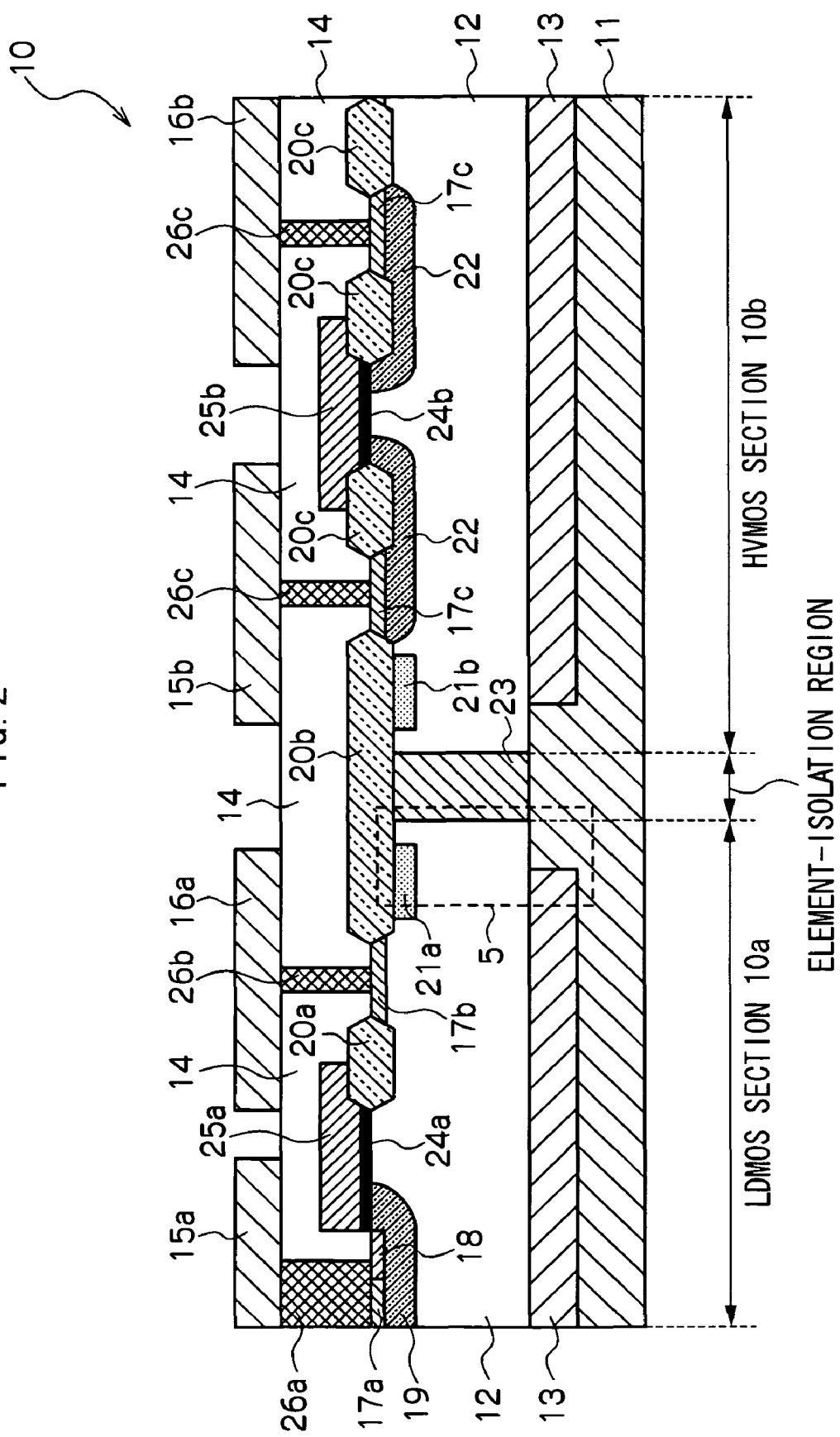
FIG. 2 is a cross-section of portions of a semiconductor device according to an exemplary embodiment of the present invention.
Figure 3:
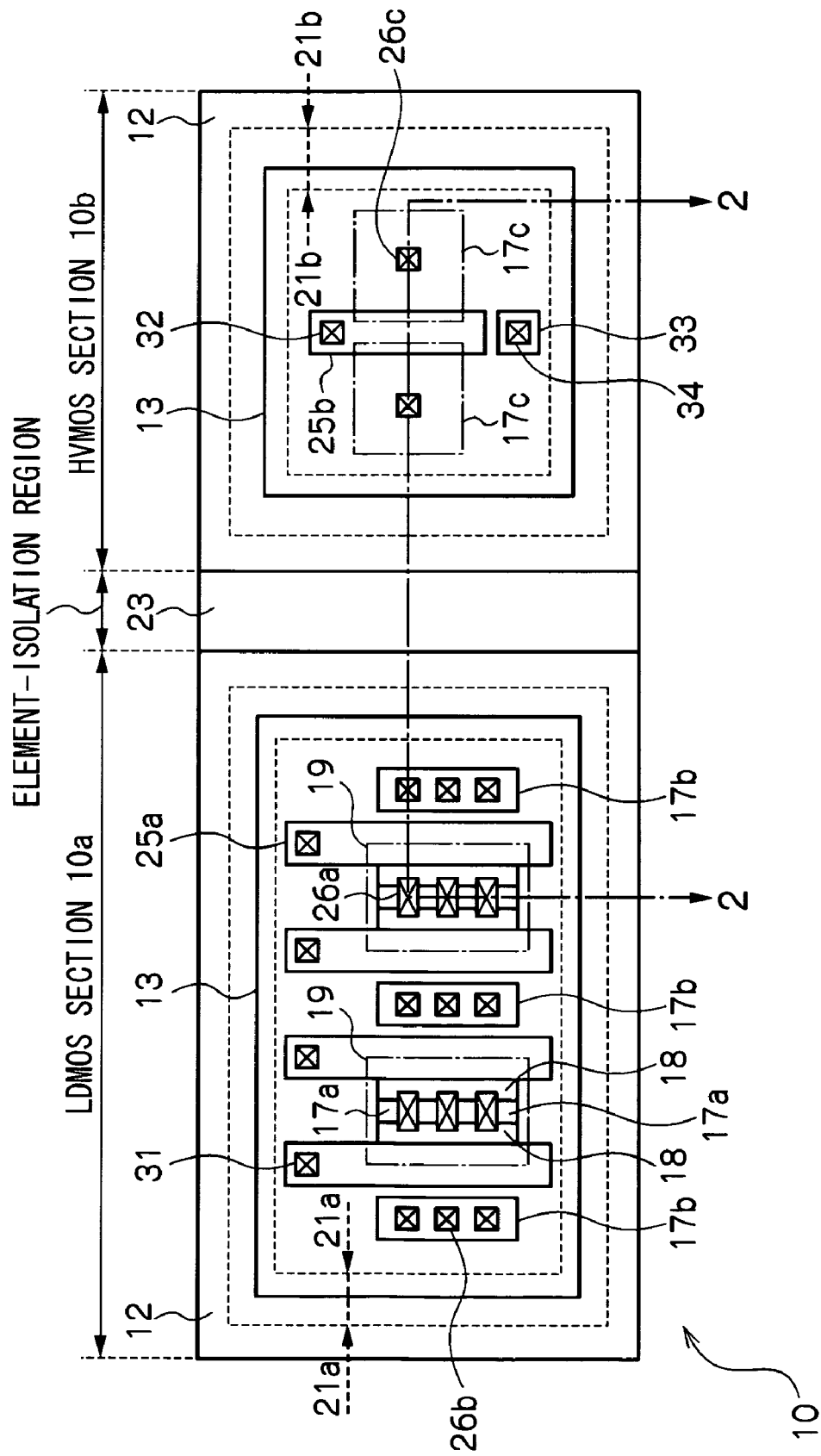
FIG. 3 is a plan view of a semiconductor device according to an exemplary embodiment of the present invention.
Figure 4:
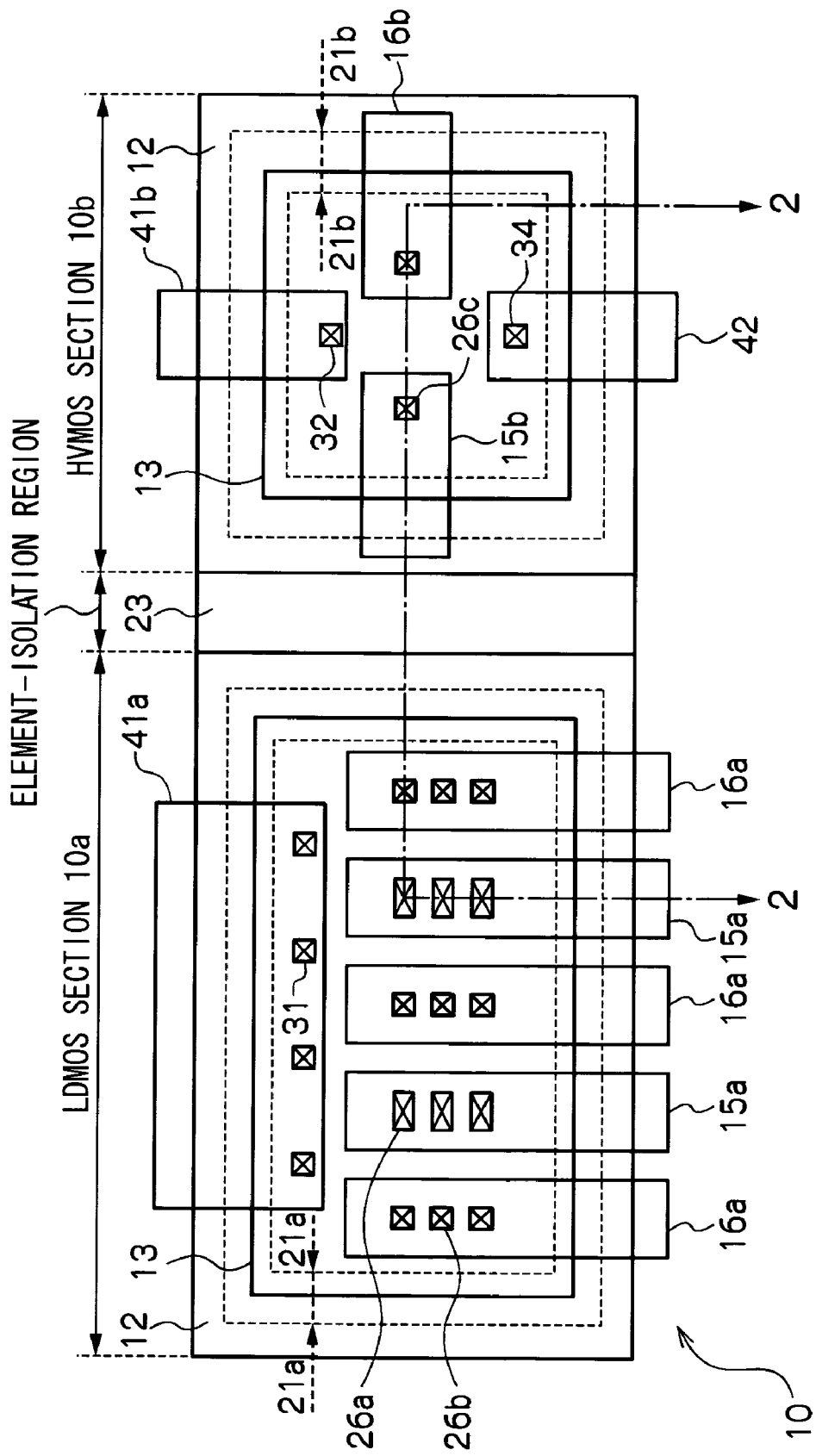
FIG. 4 is a plan view of a semiconductor device according to an exemplary embodiment of the present invention.

FIG. 2 is a cross-section of part of a semiconductor device 10 (a cross-section taken on lines 2-2 shown (with a single dashed intermittent line) in FIG. 3 and FIG. 4). As shown in FIG. 2, the semiconductor device 10 is segregated by a P-type element-isolation region, described later, into an LDMOS section 10a formed by an LDMOS transistor (LDMOS: Lateral Diffusion Metal-Oxide-Semiconductor), and an HVMOS section 10b formed from an HVMOS transistor (HVMOS: High Voltage Metal-Oxide-Semiconductor).

The semiconductor device 10 is configured from a P-type semiconductor substrate 11, an N-type epitaxial layer 12 formed above the P-type semiconductor substrate 11, an N-type buried layer 13 formed at the interface of the P-type semiconductor substrate 11 and the N-type epitaxial layer 12, an inter-layer insulating layer 14 formed above the N-type epitaxial layer 12, and an LDMOS source electrode 15a, an HVMOS source electrode 15b, an LDMOS drain electrode 16a and an HVMOS drain electrode 16b that are formed from metal wiring above the inter-layer insulating layer 14.

A first high concentration P-type region 17a (referred to below simply as $P^+$ region 17a), a second high concentration P-type region 17b (referred to below simply as $P^+$ region 17b), a first N-type high concentration region 18 (referred to below simply as $N^+$ region 18), a P-type body layer 19, a first field oxide film 20a, a second field oxide film 20b, and an LDMOS channel stopper 21a that is a second N-type high concentration region, are formed on the surface of the N-type epitaxial layer 12 of the LDMOS section 10a. Third high concentration P-type regions 17c (referred to below simply as $P^+$ regions 17c), a second field oxide film 20b, a third field oxide film 20c, an HVMOS channel stopper 21b that is a third N-type high concentration region, and a P-type drift layer 22 are formed on the surface of the N-type epitaxial layer 12 of the HVMOS section 10b. The impurity regions formed on the surface of the N-type epitaxial layer 12, and the gate oxidation film and the gate electrode etc., which will be described below, are referred to in general below as semiconductor elements. A P-type isolation region 23 is formed in the N-type epitaxial layer 12 for element-isolation of the LDMOS section 10a from the HVMOS section 10b (namely for segregating the semiconductor element formed by the LDMOS section 10a from the semiconductor elements formed by the HVMOS section 10b). The second field oxide film 20b is above the P-type isolation region 23, and is formed so as to straddle both sections of the LDMOS section 10a and the HVMOS section 10b.

An LDMOS gate oxidation film 24a, an HVMOS gate oxidation film 24b, and an LDMOS gate electrode 25a and an HVMOS gate electrode 25b formed from polycrystalline silicon, are formed above the N-type epitaxial layer 12 of the LDMOS section 10a and the HVMOS section 10b. Contact lines 26a to 26c for electrically connecting each of the source electrodes, or each of the drain electrodes, to the $P^+$ regions 17a to 17c, or to the $N^+$ region 18, are formed in the inter-layer insulating layer 14 of the LDMOS section 10a and the HVMOS section 10b. Specifically, the LDMOS source electrode 15a is connected to the $P^+$ region 17a and the $N^+$ region 18 by the contact line 26a, the LDMOS drain electrode 16a is connected to the $P^+$ region 17b by the contact line 26b, and the HVMOS source electrode 15b and the HVMOS drain electrode 16b are connected to the $P^+$ region 17c by the contact lines 26c.

Explanation will now be given of the plan view structure of the semiconductor device 10, with reference to FIG. 3 and FIG. 4. FIG. 3 is a diagram in which each of the impurity regions and the wiring layout of each of the contact lines in the semiconductor device 10 are represented in plan view. FIG. 4 is a diagram in which each type of electrode formed on the surface of the semiconductor device 10 and each contact line connected to each type of electrode is represented in plan view.

As shown in FIG. 3, there are four LDMOS gate electrodes 25a formed in rectangular shapes to the LDMOS section 10a. An LDMOS gate line 31 is connected to each of the four LDMOS gate electrodes 25a, so as to be electrically connectable to the portions external to the semiconductor device 10. The $P^+$ regions 17b are formed in rectangular shapes at both ends and at a central portion of the LDMOS section 10a. Three of the contact lines 26b are connected to each of the respective $P^+$ regions 17b, so as to be electrically connectable to portions external to the semiconductor device 10. The rectangular shaped $P^+$ region 17a and two rectangular shaped $N^+$ regions 18 on either side of the $P^+$ region 17a are formed in each of the regions interposed between two of the respective LDMOS gate electrodes 25a (excluding the central portion of the LDMOS section 10a). The P-type body layers 19 are formed so as to surround the $P^+$ region 17a and the two $N^+$ regions 18. Three rectangular shaped contact lines 26a are connected to the $P^+$ region 17a and the two $N^+$ regions 18, so as to be electrically connectable to portions external to the semiconductor device 10. A ring shaped LDMOS channel stopper 21a is formed so as to surround the contact lines 26a, 26b, the LDMOS gate line 31 and the plural impurity regions (the $P^+$ regions 17a, the $P^+$ region 17b, the $N^+$ regions 18, and the P-type body layers 19). In other words, the semiconductor elements configuring the LDMOS section 10a are surrounded by the LDMOS channel stopper 21a. Charge leakage or the like is stopped in this manner by the shape of the LDMOS channel stopper 21a surrounding the semiconductor elements configuring the LDMOS section 10a. It should be noted that the LDMOS channel stopper 21a may be configured with a portion thereof cut away, as long as there is no charge leakage or the like (i.e. a structure having a non-continuous portion). The LDMOS channel stopper 21a does not make contact with the semiconductor elements configuring the LDMOS section 10a.

The rectangular shaped HVMOS gate electrode 25b is formed at a central portion of the HVMOS section 10b. An HVMOS gate line 32 is connected to the HVMOS gate line 25b, so as to be electrically connectable to the portions external to the semiconductor device 10. A fourth N-type high concentration region 33 (referred to below simply as $N^+$ region 33) is formed at a position facing the HVMOS gate line 25b. A contact line 34 is also connected to the $N^+$ region 33, so as to be electrically connectable to the portions external to the semiconductor device 10. Two of the $P^+$ regions 17c are also formed at the left and right sides of the HVMOS gate line 25b, so that the HVMOS gate line 25b is interposed in the middle thereof. A contact line 26c is also connected to each of these two P+ regions 17c, so as to be electrically connectable to the portions external to the semiconductor device 10. A ring shaped HVMOS channel stopper 21b is formed so as to surround the contact lines 26c, the HVMOS gate line 32, the contact line 34, and the plural impurity regions (the P+ region 17c, the N+ region 33, the P-type body layer 19). In other words the semiconductor elements configuring the HVMOS section 10b are surrounded by the HVMOS channel stopper 21b. It should be noted that, also with respect to the HVMOS channel stopper 21b configuring the HVMOS section 10b, in a similar manner to the LDMOS channel stopper 21a configuring the HVMOS section 10a, charge leakage etc. can be prevented by configuration in a shape so as to surround the semiconductor elements configuring the HVMOS section 10b. The HVMOS channel stopper 21b configuring the HVMOS section 10b too may be configured with a portion thereof cut away, as long as there is no charge leakage or the like (i.e. a structure having a non-continuous portion). The HVMOS channel stopper 21b does not make contact with the semiconductor elements configuring the HVMOS section 10b.

As shown in FIG. 4, the LDMOS gate lines 31 that are connected to each of the four LDMOS gate electrodes 25a of the LDMOS section 10a are connected to LDMOS gate lead electrode 41a that is formed on the inter-layer insulating layer 14. The contact lines 26b that are connected to the rectangular shaped P+ regions 17b formed at the two ends and at a central portion of the LDMOS section 10a are connected to LDMOS drain electrodes 16a formed on the inter-layer insulating layer 14. Further, the contact lines 26a connected to the P+ region 17a and the two N+ regions 18 on either side of the P+ region 17a are connected to LDMOS source electrodes 15a formed on the inter-layer insulating layer 14.

The HVMOS gate line 32 connected to the HVMOS gate line 25b of the HVMOS section 10b is connected to an HVMOS gate lead electrode 41b formed on the inter-layer insulating layer 14. One of the contact lines 26c connected to each of the two P+ regions 17c formed on either side of the HVMOS gate line 25b is connected to the HVMOS source electrode 15b, and the other of these contact lines 26c is connected to the HVMOS drain electrode 16b. Further, the contact line 34 connected to the N+ region 33 formed in a position facing the HVMOS gate line 25b is connected to a back electrode 42.

Explanation will now be given of the positional relationship between the N-type buried layer 13, the LDMOS channel stopper 21a, and the P-type isolation region 23, with reference to FIG. 5 to FIG. 9. It should be noted that explanation will be omitted of the positional relationship between the HVMOS channel stopper 21b and the P-type isolation region 23 since it is similar to that of the explanation below, but with the LDMOS channel stopper 21a replaced with the HVMOS channel stopper 21b.

Figure 5:
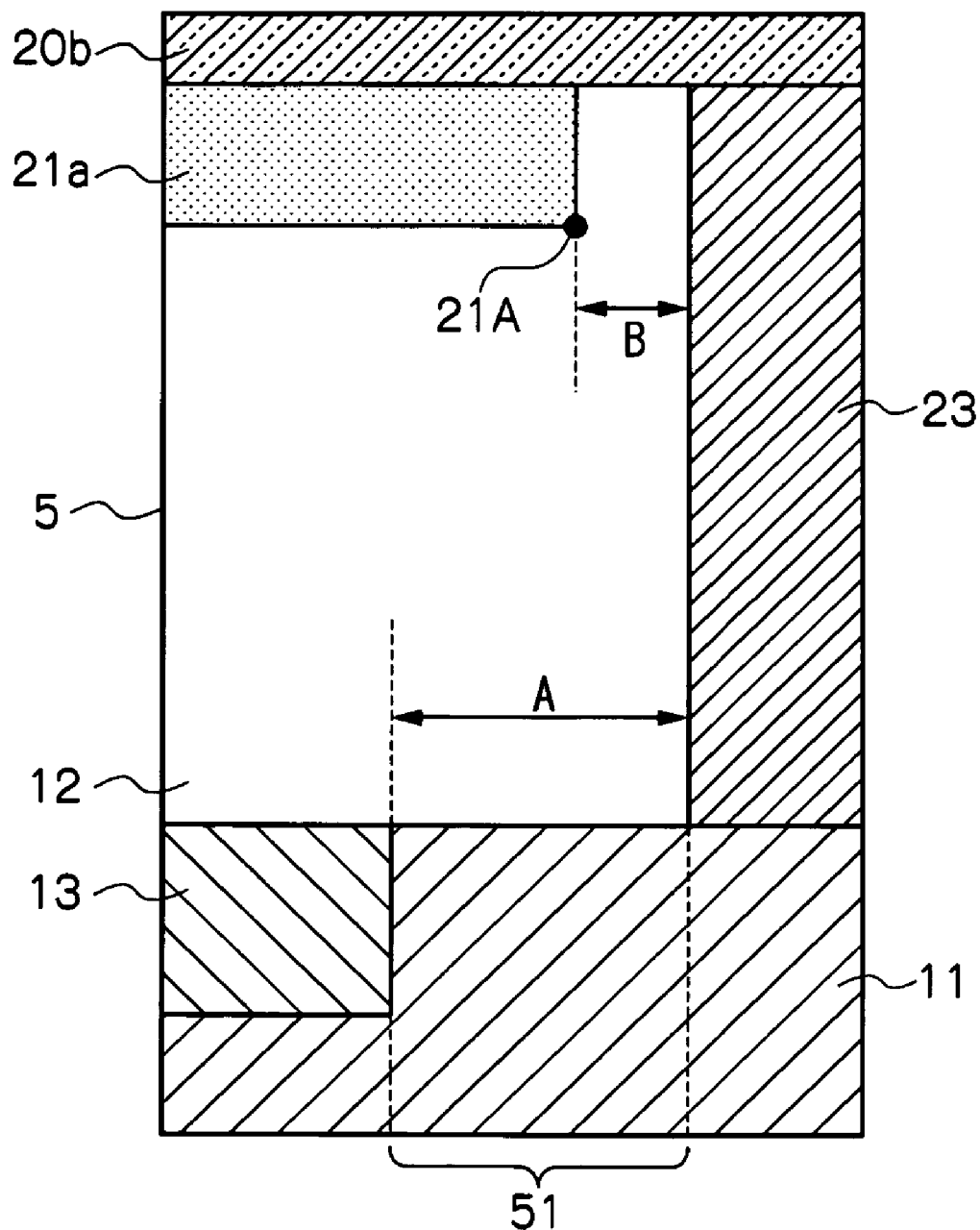
FIG. 5 is an enlarged diagram of the region 5 shown by a broken line in FIG. 2.

FIG. 5 is an enlarged diagram of the region 5 of FIG. 2 (shown by the broken line). As shown in FIG. 5, the N-type buried layer 13 is separated by a separation distance A from the P-type isolation region 23. The LDMOS channel stopper 21a is separated by a separation distance B from the P-type isolation region 23. The LDMOS channel stopper 21a is formed directly below the second field oxide film 20b that is formed above the P-type isolation region 23, and is connected thereto, therefore a channel stopper effect is obtained. Note that preferably at least one portion of the LDMOS channel stopper 21a should face toward the N-type buried layer 13. As shown in FIG. 5, an outside end portion 21A of the LDMOS channel stopper 21a that surrounds the impurity regions and semiconductor elements formed on the surface of the N-type epitaxial layer 12 shown in FIG. 2 to FIG. 4, these being the LDMOS gate oxidation film 24a, the HVMOS gate line 25b etc., is within a region that faces an isolation region 51 between the P-type isolation region 23 and the N-type buried layer 13 (namely faces the region of the separation portion of separation distance B from the P-type isolation region 23 to the N-type buried layer 13, or the region not formed with the N-type buried layer 13).

Figure 6:
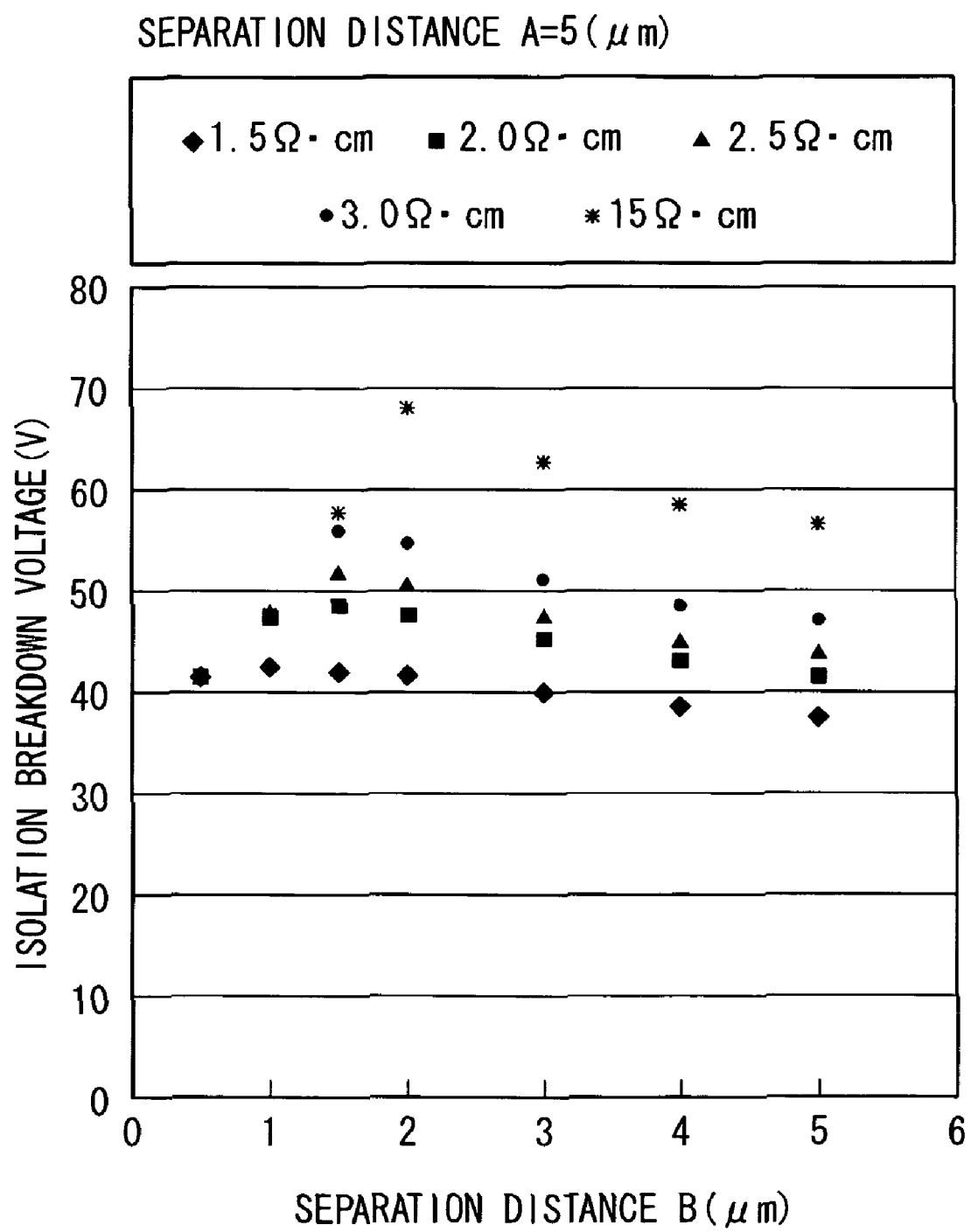
FIG. 6 is graph showing the change in isolation breakdown voltage in a semiconductor device of the an exemplary embodiment of the present invention.

FIG. 6 is a graph based on test results, showing the change in isolation breakdown voltage of each semiconductor device when the separation distance B (the separation distance from the P-type isolation region 23 to the LDMOS channel stopper 21a) is changed for each of semiconductor devices having different specific resistances of the P-type semiconductor substrate 11. The horizontal axis shows the separation distance B (μm: micrometers), and the vertical axis shows the isolation breakdown voltage (V: volts). There are 5 values for the specific resistance of the P-type semiconductor substrate 11, 1.5 Ω·cm (Ohm-centimeters), 2.0 Ω·cm, 2.5 Ω·cm, 3.0 Ω·cm, and 15 Ω·cm. The separation distance A (the separation distance from the P-type isolation region 23 to the N-type buried layer 13) is fixed at 5 μm. As shown in FIG. 6, with different specific resistances the isolation breakdown voltage is at the maximum value when the separation distance B is from 1.5 μm to 2.0 μm. The isolation breakdown voltage of the semiconductor device gradually decreases as the separation distance B approaches the separation distance A (namely as the outside end portion 21A of the LDMOS channel stopper 21a gets nearer to the end portion (outside end) of the N-type buried layer 13).

Figure 7:
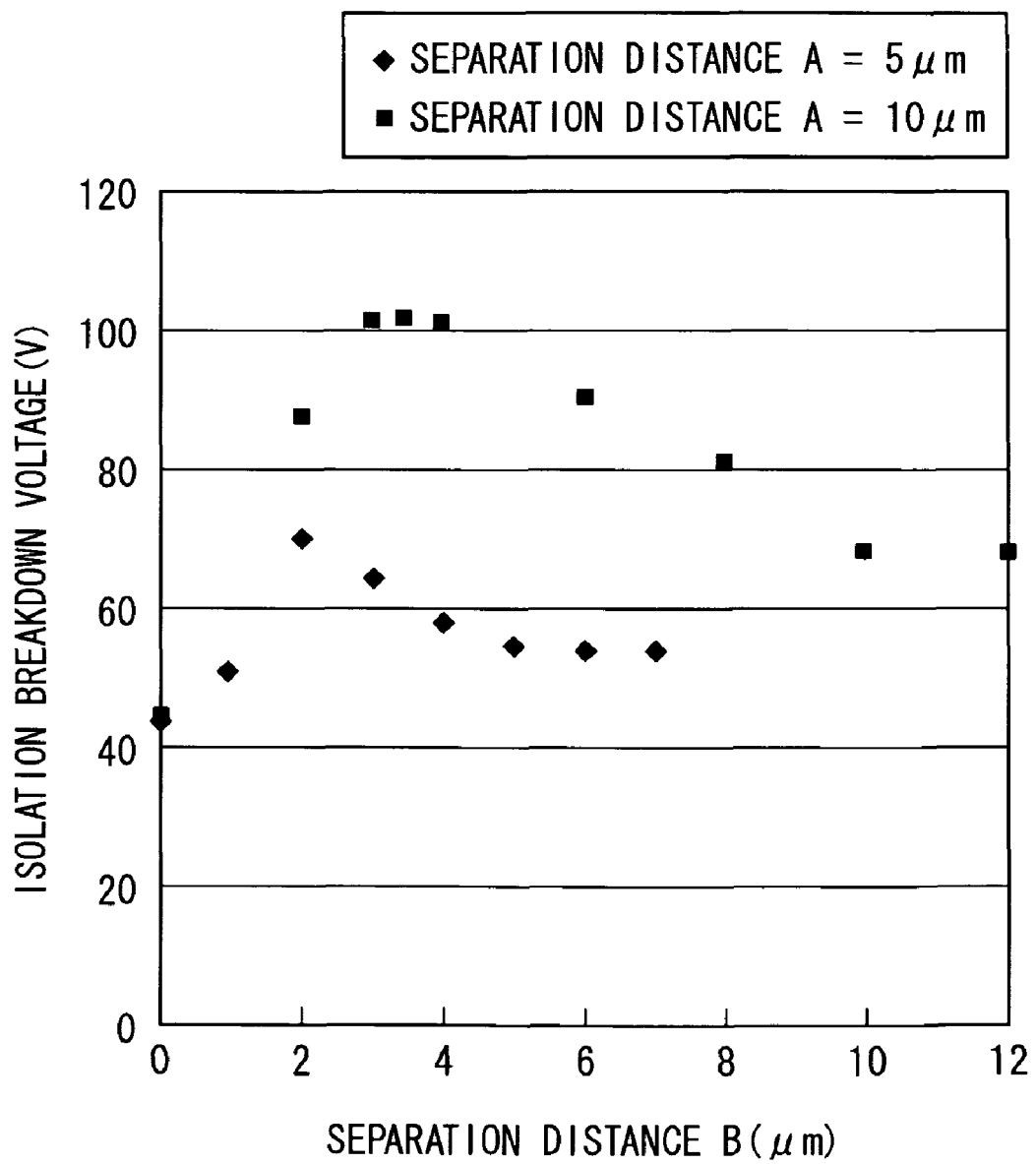
FIG. 7 is graph showing the change in isolation breakdown voltage in a semiconductor device of the an exemplary embodiment of the present invention.

FIG. 7 is a graph showing the change in isolation breakdown voltage of semiconductor devices when the separation distance B is changed, for two semiconductor devices having different separation distances A. The horizontal axis shows the separation distance B (μm: micrometers), and the vertical axis shows the isolation breakdown voltage (V: volts). There are two values for the separation distance B, 5 μm and 10 μm. The specific resistance of the P-type semiconductor substrate 11 is 15 Ω·cm. This is done since, as can be seen from FIG. 6, the change in isolation breakdown voltage becomes more significant the higher the specific resistance.

As can be seen from FIG. 7, when the separation distance B is zero (separation distance B=0: the LDMOS channel stopper 21a and the P-type isolation region are in a state of contact) the isolation breakdown voltage of the semiconductor device is about 45V, independent of the separation distance A. When the separation distance B is greater than 0 (separation distance B>0) (namely when the LDMOS channel stopper 21a is separated from the P-type isolation region) the isolation breakdown voltage of the semiconductor device gradually rises. Namely, it is clear that a higher isolation breakdown voltage of the semiconductor device is obtained by not having the LDMOS channel stopper 21a in contact with the P-type isolation region 23, and instead having a specific separation distance therebetween.

The isolation breakdown voltage of the semiconductor device when the separation distance A is 10 μm has a maximum value (about 100V) when the separation distance B is about 3 to 4 μm. In addition, as explained above, the isolation breakdown voltage of the semiconductor device at a separation distance A of 5 μm has a maximum value (about 70V) when the separation distance B is about 1.5 μm to 2.0 μm. Namely, the isolation breakdown voltage of the semiconductor device is at the maximum value when the separation distance B is at a value within a specific range of the separation distance A (cases where the outer peripheral end portion of the LDMOS channel stopper 21a is in a position correspond to a midpoint between the N-type buried layer 13 and the P-type isolation region 23). The separation distance B being a value within a specific range of separation distance A as described above means, for example, setting the separation distance B at a value that is from 20% to 60% of the separation distance A. Preferably the separation distance B is set at a value that is from 30% to 40% of the separation distance A.

When the value of separation distance B is greater than the separation distance A (when the LDMOS channel stopper 21a is more separated from the P-type isolation region 23 than the N-type buried layer 13 is separated from the P-type isolation region 23) then change in the isolation breakdown voltage of the semiconductor device substantially disappears. This means that an increase in the isolation breakdown voltage of the semiconductor device can be achieved by setting the position of the outside end portion 21A of the LDMOS channel stopper 21a so as to be in a range that at least corresponds to a position between the P-type isolation region 23 and the N-type buried layer 13.

Figure 8A:
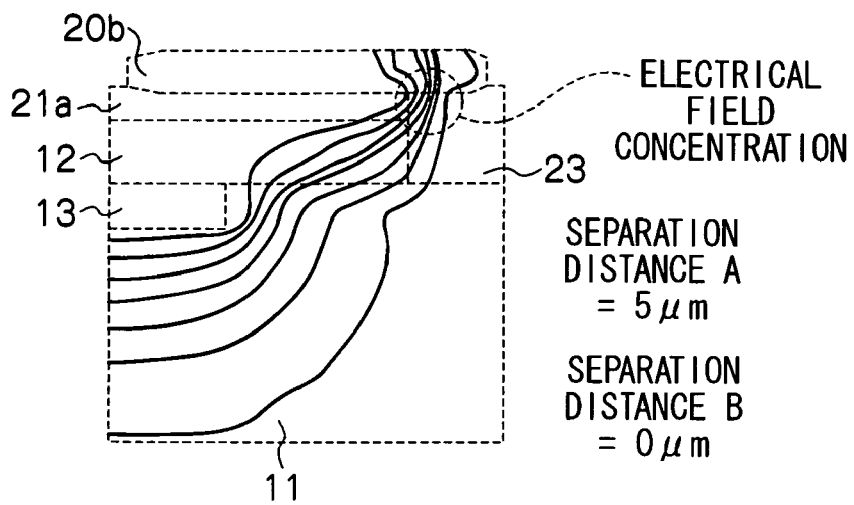
FIG. 8A to 8C are schematic diagrams showing the state of the electrical field within a semiconductor device according to an exemplary embodiment of the present invention as equivalent potential lines.
Figure 8B:
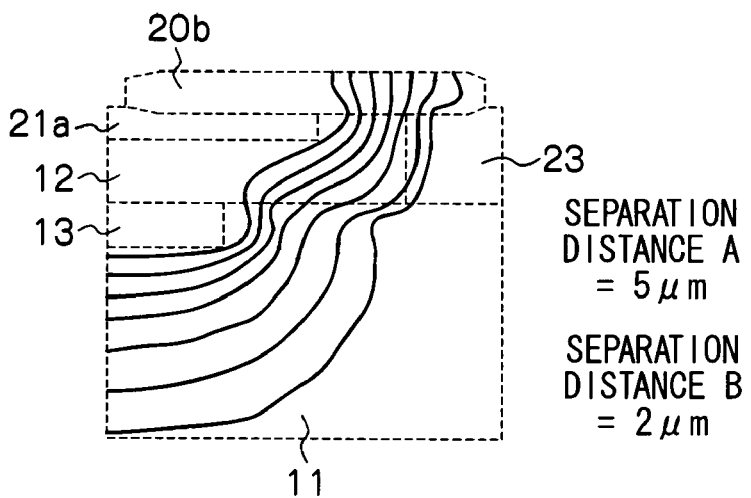
Figure 8C:
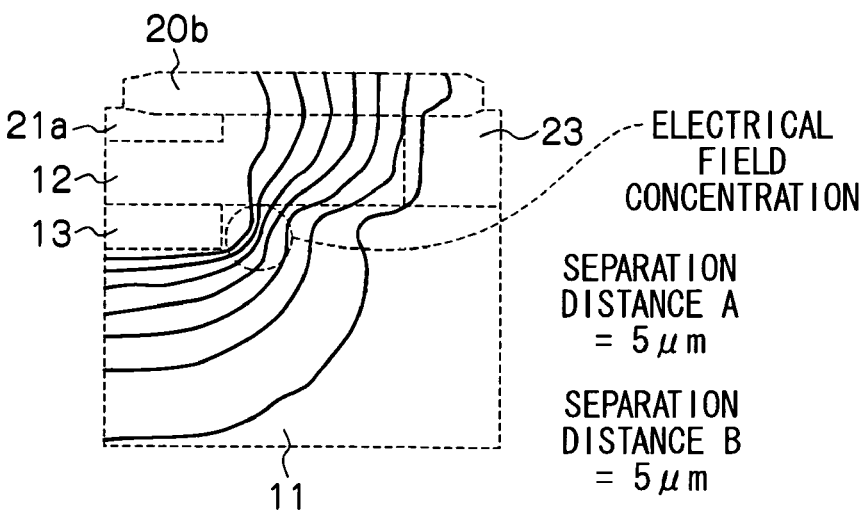
Figure 9A:
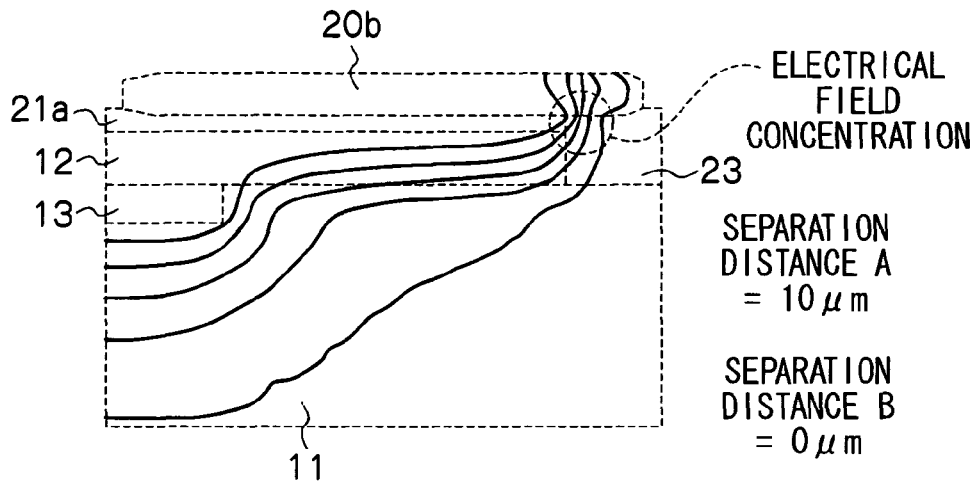
FIG. 9A to 9C are schematic diagrams showing the state of the electrical field within a semiconductor device according to an exemplary embodiment of the present invention as equivalent potential lines.
Figure 9B:
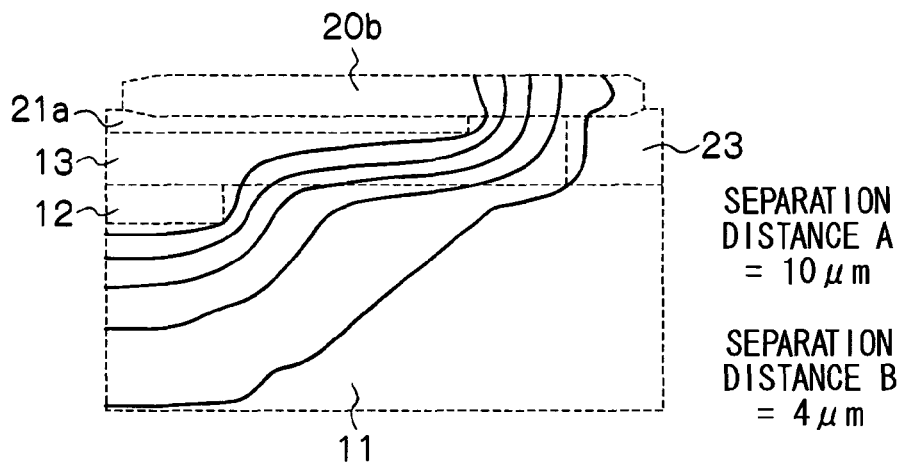
Figure 9C:
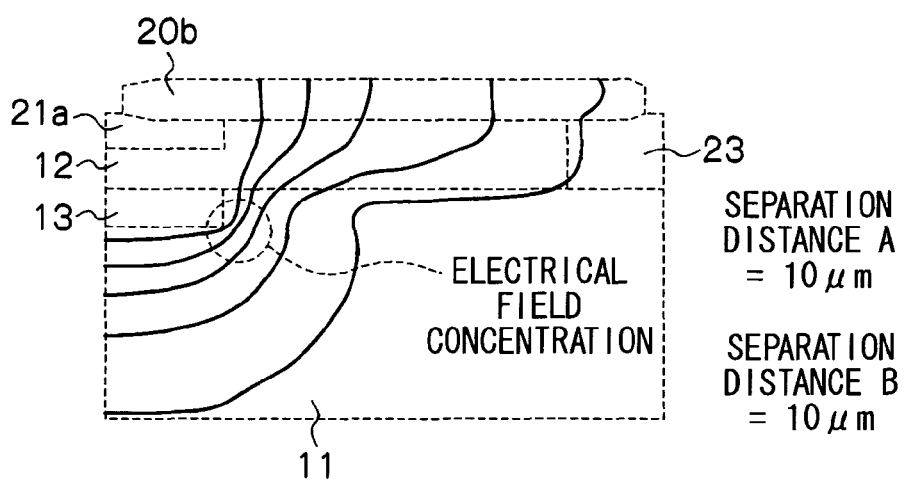

FIG. 8A to FIG. 8C are schematic diagrams showing equivalent electrical potential lines of state of an electrical field in the semiconductor device 10 where the separation distance B is changed and the separation distance A is at 5 µm. FIG. 9A to FIG. 9C are schematic diagrams showing equivalent electrical potential lines of state of an electrical field in the semiconductor device 10 where the separation distance B is changed and the separation distance A is at 10 µm. FIG. 8A to FIG. 8C are schematic diagrams for state where separation distance B is 0 µm (FIG. 8A), 2 µm (FIG. 8B), and 5 µm (FIG. 8C). FIG. 9A to FIG. 9C are schematic diagrams for state where separation distance B is 0 µm (FIG. 9A), 4 µm (FIG. 9B), and 10 µm (FIG. 9C).

As can be seen from FIGS. 8A to 8C and FIGS. 9A to 9C, when the separation distance B=0 (namely when the LDMOS channel stopper 21a is in a state of contact with the P-type isolation region 23), the equivalent electrical potential lines are densely packed in the vicinity of the interface of the P-type isolation region and the LDMOS channel stopper 21a, and so a concentrated electrical field is generated. When the separation distance B is equivalent to the separation distance A (namely the position of the outside end portion 21A of the LDMOS channel stopper 21a and the position of the end portion of the N-type buried layer 13 are equivalent in the thickness direction of the semiconductor device 10), electrical field concentration is generated in the vicinity of the N-type buried layer 13. In addition, as shown in FIG. 8B and FIG. 9B, when the separation distance B is a value that is about 40% of the separation distance A, there is no electrical field concentration generated. A high isolation breakdown voltage like that shown in FIG. 7 cannot be obtained when electrical field concentration is generated as described above. In contrast, when the electrical potential distribution within the semiconductor device 10 is uniform, then a high isolation breakdown voltage is obtained. Therefore, it can be seen that a high isolation breakdown voltage in the semiconductor device can be obtained by adjusting the position for forming the LDMOS channel stopper 21a, making the electrical potential distribution within the semiconductor device 10 uniform.

In order to raise the isolation breakdown voltage in the semiconductor device 10 the necessity arises from the above to form the LDMOS channel stopper 21a such that the outside end portion 21A of the LDMOS channel stopper 21a is positioned so as to be more to the outside than the outer peripheral end of the N-type buried layer 13. There is also a necessity to form the LDMOS channel stopper 21a so as not to make contact with the P-type isolation region 23. In other words, the outside end portion 21A of the LDMOS channel stopper 21a needs to be within a region facing the isolation region 51 between the P-type isolation region 23 and the N-type buried layer 13 (directly below the second field oxide film 20b, positioned so as to be aligned with a non-continuous portion, where the N-type buried layer 13 of the P-type semiconductor substrate 11 is not formed). In order to achieve an even higher breakdown voltage of the semiconductor device 10, the LDMOS channel stopper 21a is preferably formed such that the outside end portion 21A of the LDMOS channel stopper 21a is positioned aligned with a central portion of the isolation region 51 between the P-type isolation region 23 and the N-type buried layer 13. With regard to specific numerical values for the position aligned with a central portion of the isolation region 51, it can be seen from the above results that the separation distance from the P-type isolation region 23 to the LDMOS channel stopper 21a should preferably be 20% to 60% of the separation distance from the P-type isolation region 23 to the N-type buried layer 13. The separation distance from the P-type isolation region 23 to the LDMOS channel stopper 21a should more preferably be 30% to 40% of the separation distance from the P-type isolation region 23 to the N-type buried layer 13.

Explanation will now be given of a fabrication method for the semiconductor device according to an exemplary embodiment, with reference to FIG. 10A to FIG. 13D.

Figure 10A:
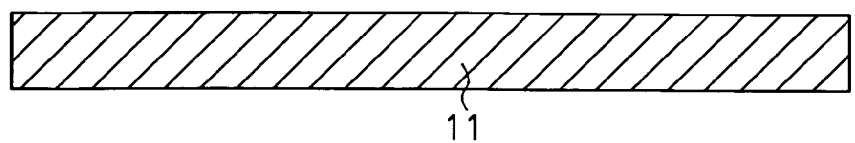
FIG. 10A to 10E are cross-sections of fabrication processes of a semiconductor device according to an exemplary embodiment of the present invention.
Figure 10B:
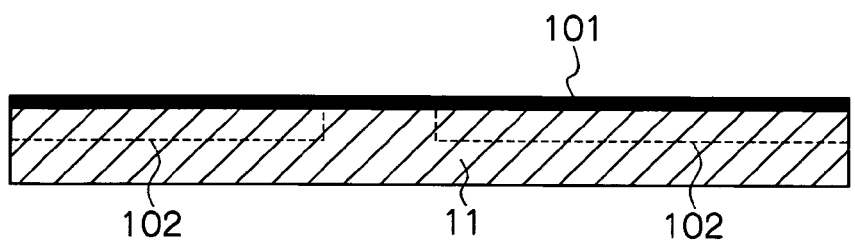
Figure 10C:
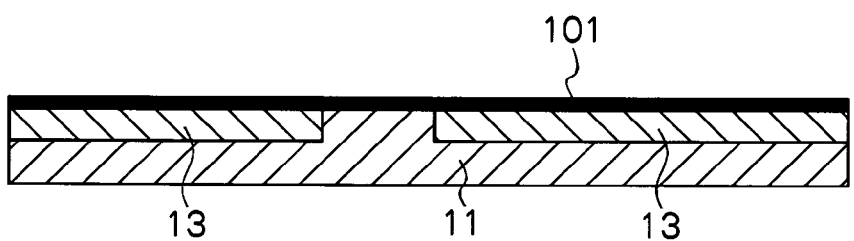

First, the P-type semiconductor substrate 11 is prepared (FIG. 10A). The specific resistance of the P-type semiconductor substrate 11 may, for example, be 3 Ω·cm. A silicon oxide film 101 is formed by a thermal oxidation method on the prepared P-type semiconductor substrate 11 (FIG. 10B). The film thickness of the silicon oxide film 101 may, for example, be 20 nm. After forming the silicon oxide film 101, a resist is applied to the silicon oxide film 101. This resist is then patterned by lithography. Arsenic ions are then implanted in the broken-line region 102 (FIG. 10B) of the P-type semiconductor substrate 11 while using the patterned resist as a mask. As shown in FIG. 10B, the regions in which the arsenic ions are implanted are formed at specific intervals (namely, include non-continuous portions). This is done in order that the P-type isolation region 23 can be formed afterwards in the regions that are not implanted with the arsenic ions (on the P-type semiconductor substrate 11). The above specific interval needs to be set so as to be separated by a specific separation distance from the P-type isolation region 23 to be formed later. The implantation amount of the arsenic ions may be $1 \times 10^{15}$ cm$^{-2}$. This resist is then removed, and boron ions are then implanted into the whole of the surface of the P-type semiconductor substrate 11. The implantation amount of the boron ions may be $2 \times 10^{12}$ cm$^{-2}$. The P-type semiconductor substrate 11 with boron ions implanted into the surface thereof is then subjected to thermal processing at about 950° C. The arsenic ions implanted regions in the P-type semiconductor substrate 11 are activated by this processing, forming the N-type buried layer 13 in these regions implanted with arsenic ions (FIG. 10C).

Figure 10D:
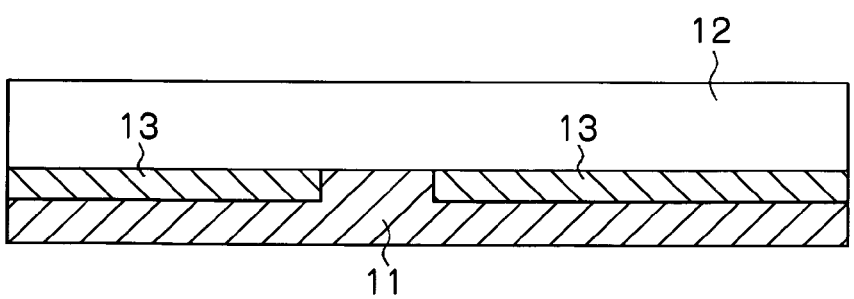

Next, the silicon oxide film 101 formed by the above thermal oxidation method is removed. An N-type epitaxial layer 12 is then formed using an epitaxial growth method on the surface of the P-type semiconductor substrate 11 from which the silicon oxide film 101 has been removed (FIG. 10D). The P-type semiconductor substrate 11 may, for example, be subjected to thermal processing at 1150° C. in a monosilane gas and hydrogen gas atmosphere. The thickness of the N-type epitaxial layer 12 may be about 3 μm.

Figure 10E:
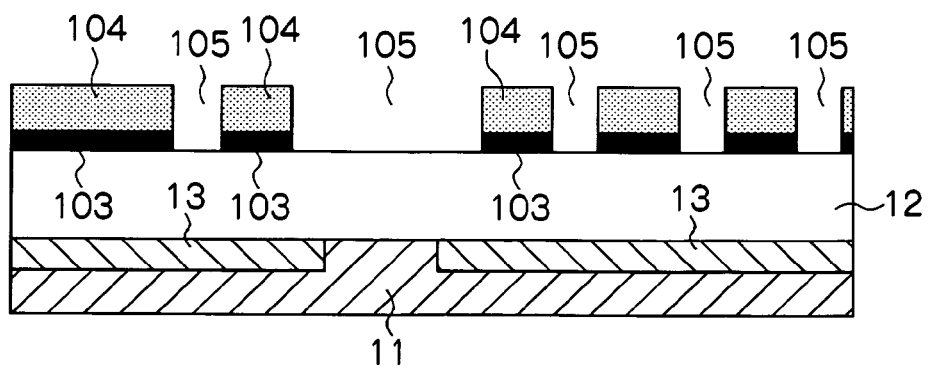

A silicon oxide film 103 is then formed using a thermal oxidation method on the N-type epitaxial layer 12. This is followed by forming a silicon nitride film 104 on the silicon oxide film 103 using a CVD (Chemical Vapor Deposition) method. The film thickness of the silicon oxide film 103 may, for example, be 25 nm and the film thickness of the silicon nitride film 104 may be 200 nm. Resist is then applied to the silicon nitride film 104. This resist is then patterned by lithography. The silicon oxide film 103 and the silicon nitride film 104 are then subjected to etching using this patterned resist as a mask. Plural through holes 105 are formed penetrating through the silicon oxide film 103 and the silicon nitride film 104 by this etching, exposing portions of the N-type epitaxial layer 12 (FIG. 10E).

Figure 11A:
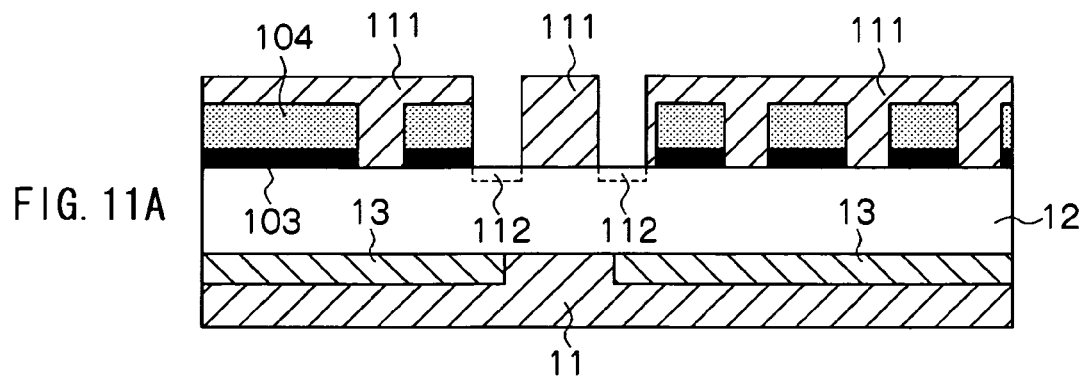
FIG. 11A to 11D are cross-sections of fabrication processes of a semiconductor device according to an exemplary embodiment of the present invention.

A resist 111 is then coated so as to fill the through holes 105. The resist 111 is then patterned using a lithography (FIG. 11A). Phosphorous ions are then implanted into the broken-line regions 112 in the N-type epitaxial layer 12 using the resist 111 as a mask (FIG. 11A). The ion implanted broken-line regions 112 are set so as to be positioned separated from the P-type isolation region 23 that will be formed later. The phosphorous ion implantation amount may be $5 \times 10^{12}$ cm$^{-2}$. It should be noted that the phosphorous ion implantation is ion implantation at low energy, such that ion implantation is performed with the phosphorous ion implanted region (broken-line regions 112) not reaching the N-type buried layer 13. It should be noted that the ion implantation of the phosphorous ions is performed so as to give rise to ring shaped ion implantation regions, like the LDMOS channel stopper 21a and HVMOS channel stopper 21b shown in FIG. 3. This is undertaken such that the regions for phosphorous ion implantation (broken-line regions 112) become the LDMOS channel stopper 21a and the HVMOS channel stopper 21b by thermal processing as described later. The regions in which phosphorous ions are ion implanted (the broken-line regions 112) are provided positioned such that at least a portion faces the N-type buried layer 13.

Figure 11B:
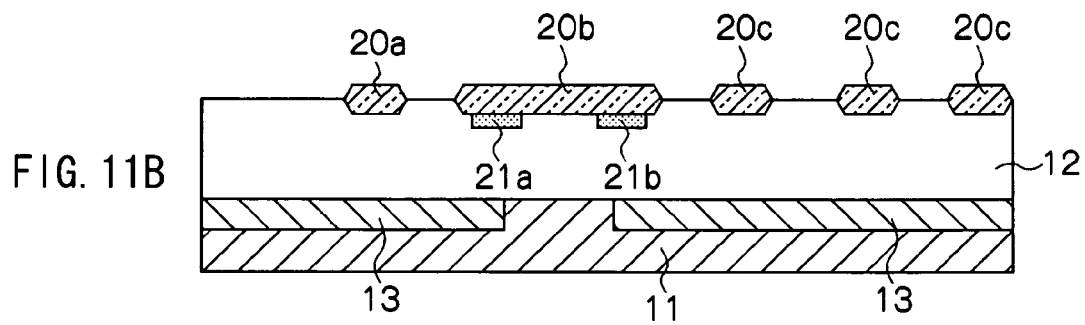

The resist 111 is then removed, and the surface of the N-type epitaxial layer 12 exposed by the through holes 105 is subjected to thermal oxidation processing at 950° C. First to third field oxide films 20a to 20c are formed by this thermal processing on the exposed surface of the N-type epitaxial layer 12. The phosphorous ion implanted regions are activate by this thermal processing, forming the LDMOS channel stopper 21a and HVMOS channel stopper 21b. The silicon oxide film 103 and the silicon nitride film 104 are then removed (FIG. 11B). It should be noted that as well as using a LCOS method (Local Oxidation of Silicon) as described above, as the method for forming the first to third field oxide films 20a to 20c, a STI (Shallow Trench Isolation) method may also be used for forming an oxidized film for segregating.

Figure 11C:
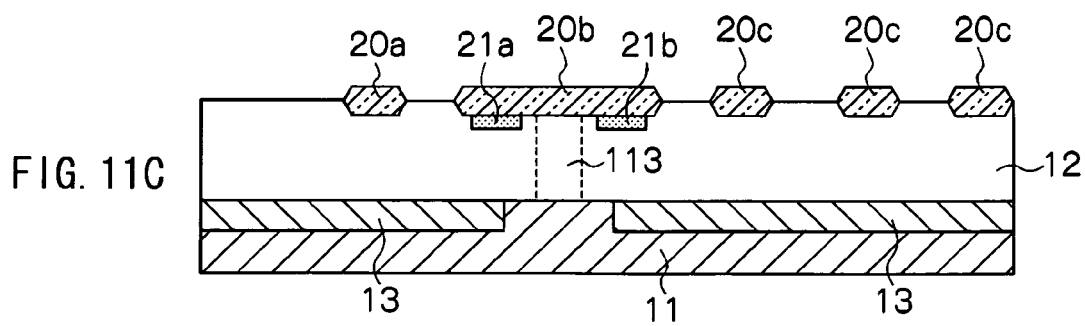

Next, a sacrificial oxidized film (not illustrated) is formed to the N-type epitaxial layer 12 and the first to third field oxide films 20a to 20c using a thermal oxidation method. The film thickness of the sacrificial oxidized film may, for example, be 20 nm. Resist is coated on this sacrificial oxidized film. The resist is then patterned using lithography. Boron ions are then implanted to the broken-line regions 113 in the N-type epitaxial layer 12 using this patterned resist as a mask (FIG. 11C). The regions implanted with boron ions (broken-line regions 113) are made such that the interface of the second field oxide film 20b and the N-type epitaxial layer 12 reaches to the interface of the P-type semiconductor substrate 11 and the N-type epitaxial layer 12 (portion where N-type buried layer 13 is separated). The regions implanted with boron ions (broken-line regions 113) do not make contact with the LDMOS channel stopper 21a and the HVMOS channel stopper 21b, and are formed at specific intervals.

Figure 11D:
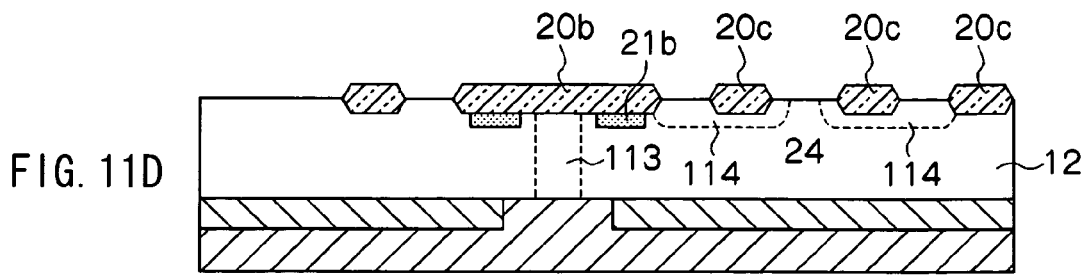

Next, the above resist is removed, and a new resist is applied to the sacrificial oxidized film. Patterning is then made of this resist using lithography. Then boron ions are implanted to the broken-line regions 114 in the N-type epitaxial layer 12 using this patterned resist as a mask (FIG. 11D). It should be noted that the regions implanted with boron ions (broken-line regions 114) are preferably formed so as not to make contact with the HVMOS channel stopper 21b. This is because if the broken-line regions 114 and the HVMOS channel stopper 21b make contact the breakdown voltage of the semiconductor device 10 is decreased.

Figure 12A:
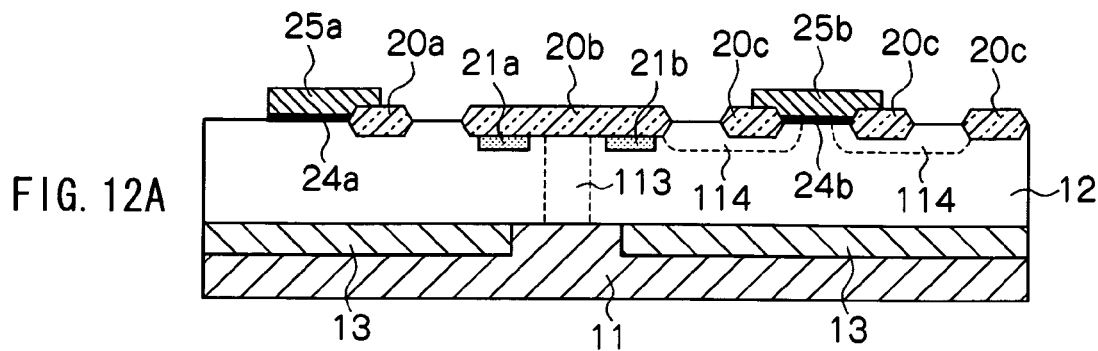
FIG. 12A to 12D are cross-sections of fabrication processes of a semiconductor device according to an exemplary embodiment of the present invention.
Figure 12B:
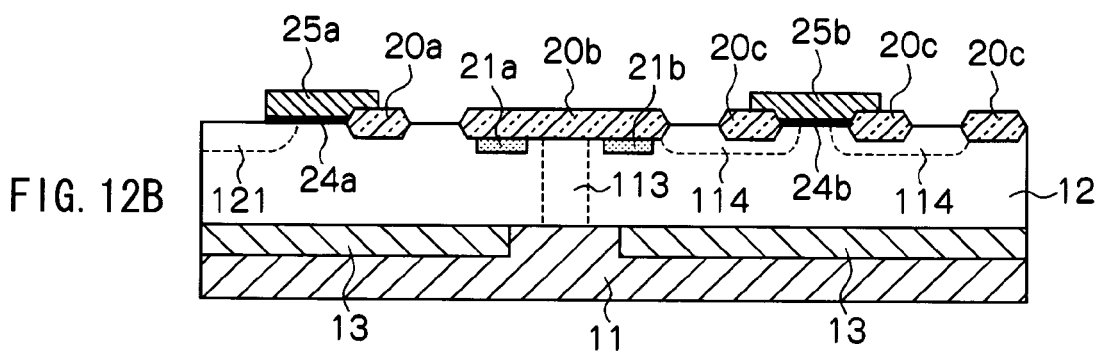

This resist and the sacrificial oxidized film are next removed. The LDMOS gate oxidation film 24a and the HVMOS gate oxidation film 24b are then formed on the N-type epitaxial layer 12, the first field oxide film 20a and the third field oxide film 20c using a thermal oxidation method. Poly-crystalline silicon is then deposited on the LDMOS gate oxidation film 24a and the HVMOS gate oxidation film 24b using a CVD method. Resist is applied onto the deposited poly-crystalline silicon. This resist is then patterned using lithography. The LDMOS gate oxidation film 24a, the HVMOS gate oxidation film 24b and the poly-crystalline silicon are then subjected to etching using this patterned resist as a mask. The LDMOS gate oxidation film 24a, HVMOS gate oxidation film 24b, the LDMOS gate electrode 25a and the HVMOS gate line 25b are formed by this etching only in specific locations (FIG. 12A).

A resist is then applied onto the N-type epitaxial layer 12, the first to third field oxide films 20a to 20c, the LDMOS gate electrode 25a, and the HVMOS gate line 25b. The resist is then patterned using lithography. Boron ions are implanted into a broken-line region 121 in the N-type epitaxial layer 12 (FIG. 12B) using this patterned resist as a mask.

Figure 12C:
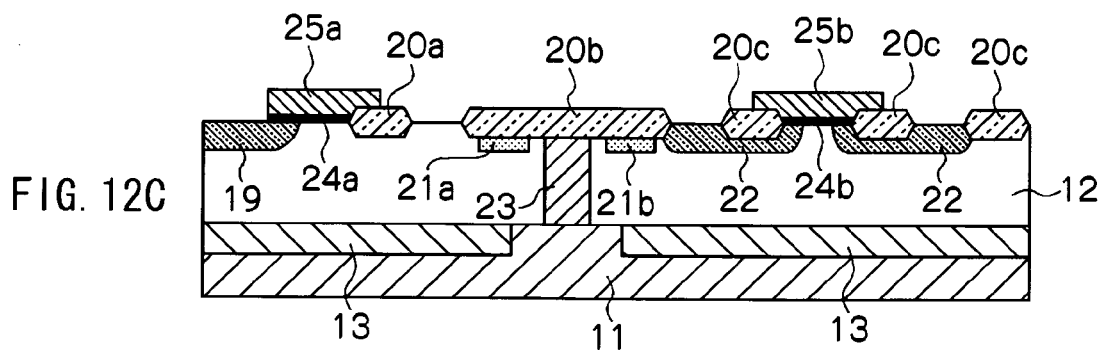

The N-type epitaxial layer 12, formed with the LDMOS gate electrode 25a, the HVMOS gate line 25b and plural impurity regions as above, is then subjected to thermal processing at about 1050° C. The impurities of the above ion implanted regions (the broken-line regions 113, 114, and 121) are diffused and activated by this thermal processing, and the P-type body layer 19, the P-type drift layer 22, and the P-type isolation region 23 are formed in the N-type epitaxial layer 12 (FIG. 12C).

Figure 12D:
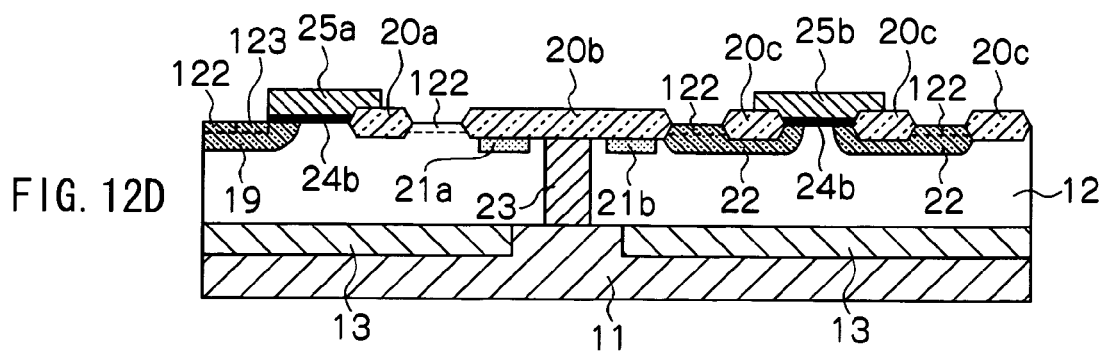

Resist is then applied to the N-type epitaxial layer 12, the first to third field oxide films 20a to 20c, the LDMOS gate electrode 25a and the HVMOS gate line 25b. This resist is then patterned using lithography. Boron ions are implanted into the broken-line regions 122 in the N-type epitaxial layer 12, into the P-type body layer 19, the P-type drift layer 22 (FIG. 12D) using this patterned resist as a mask. The above resist is then removed, and new resist is applied to the N-type epitaxial layer 12, the first to third field oxide films 20a to 20c, the LDMOS gate electrode 25a, and the HVMOS gate line 25b. This resist is then patterned using lithography. Arsenic ions are implanted into a broken-line region 123 in the P-type body layer 19 using this patterned resist as a mask (FIG. 12D).

Figure 13A:
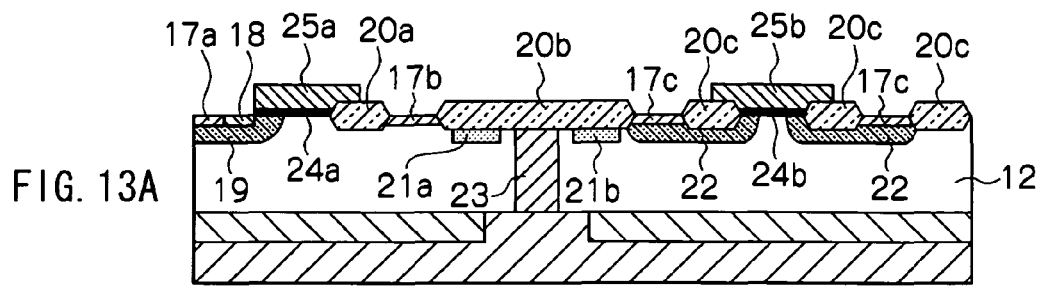
FIG. 13A to 13D are cross-sections of fabrication processes of a semiconductor device according to an exemplary embodiment of the present invention.

The N-type epitaxial layer 12 formed with plural impurity regions is then subjected to thermal processing at about 950° C. The impurities of the above ion implanted regions (the broken-line regions 122, 123) are diffused and activated by this thermal processing, forming the first to third high concentration P-type regions 17a to 17c (referred to below simply as P$^+$ regions 17a to 17c) and the first N-type high concentration region 18 (referred to below simply as N$^+$ region 18) in the N-type epitaxial layer 12, the P-type body layer 19, and the P-type drift layer 22 (FIG. 13A).

Figure 13B:
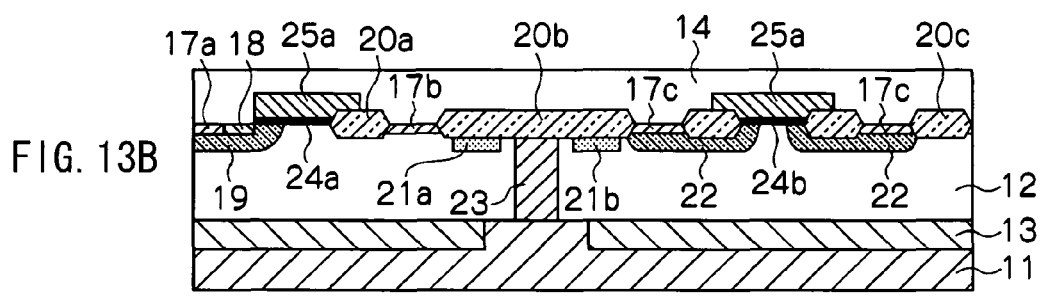

The inter-layer insulating layer 14 is then formed by a CVD method on the N-type epitaxial layer 12, the first to third field oxide films 20a to 20c, the LDMOS gate electrode 25a, and the HVMOS gate line 25b. The formed inter-layer insulating layer 14 is then subjected to polishing using a CMP (Chemical Mechanical Polishing) method. The inter-layer insulating layer 14 is flattened by this polishing (FIG. 13B).

Figure 13C:
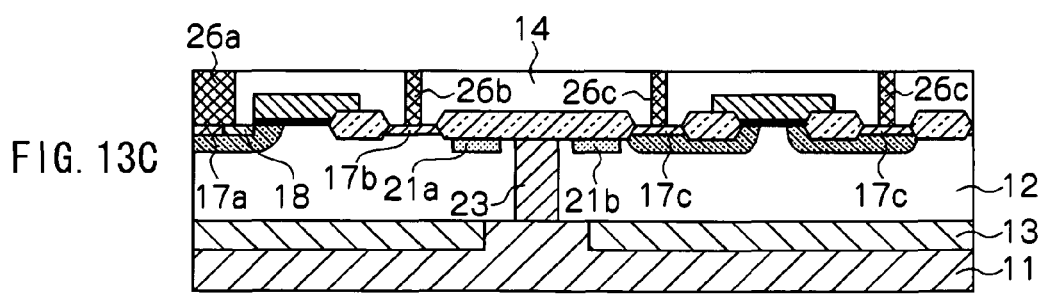

Resist is then applied to the inter-layer insulating layer 14. This resist is then patterned using lithography. The inter-layer insulating layer 14 is subjected to etching using this patterned resist as a mask. Contact holes are formed by this etching so as to reach the P$^+$ regions 17a to 17c and the N$^+$ region 18 in the inter-layer insulating layer 14. Tungsten is also filled into these contact holes using a CVD method with titanium nitride as an undercoat. Contact lines 22a to 22c are formed in the inter-layer insulating layer 14 by this tungsten filling (FIG. 13C).

Figure 13D:
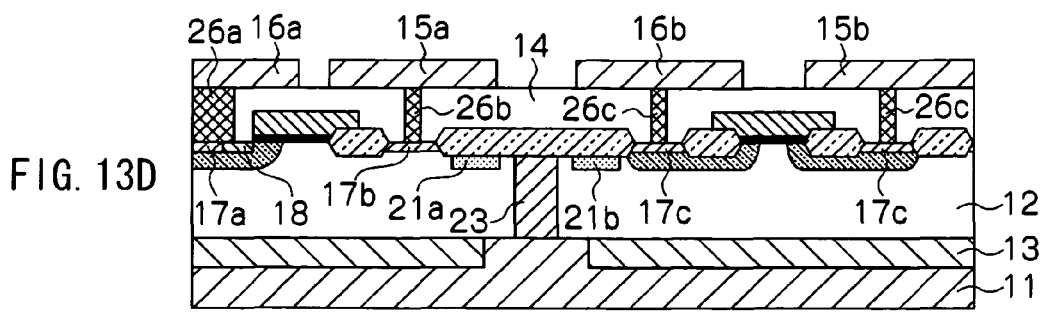

A metal wiring layer is formed from tungsten and aluminum on the inter-layer insulating layer 14 and the contact lines 26a to 26c using a sputtering method. Resist is coated on this metal wiring layer. This resist is then patterned using lithography. The metal wiring layer is then subjected to etching using this patterned resist as a mask. The LDMOS source electrode 15a, the HVMOS source electrode 15b, the LDMOS drain electrode 16a, and the HVMOS drain electrode 16b are formed by this etching (FIG. 13D). It should be noted that, while not shown in FIG. 13D, the LDMOS gate lead electrode 41a, the HVMOS gate lead electrode 41b, and the back electrode 42 are also formed at the same time as forming the above drain electrodes and source electrodes. By the above processes, fabrication processes are completed of the semiconductor device 10 that includes the LDMOS section 10a and the HVMOS section 10b.

As described above, the semiconductor device according to the present invention, as well as burying a channel stopper in the surface of an N-type epitaxial layer formed on a P-type semiconductor substrate, also has the channel stopper surrounding the semiconductor elements formed on the surface of the N-type epitaxial layer and being separated from the P-type element-isolation regions for segregating these semiconductor elements. The isolation breakdown voltage of the semiconductor device can thereby be increased to a high breakdown voltage.

It should be noted that the P-type and N-type of the semiconductor device 10 of the exemplary embodiment may be swapped over. Also, though the N-type epitaxial layer 12 was formed on the P-type semiconductor substrate 11, an N-type region may be formed by ion implantation on the P-type semiconductor substrate 11 in place of the N-type epitaxial layer 12.

In the above exemplary embodiment the semiconductor device 10 is configured with an LDMOS section 10a and an HVMOS section 10b, however configuration may be made with either one of these sections alone. In addition, in place of the LDMOS section 10a or the HVMOS section 10b, a CMOS structure may be adopted, and such a CMOS structure surrounded by a channel stopper.

—Exemplary Modification of the Present Invention—

The semiconductor device of the present invention may be a semiconductor device with bi-polar transistors instead of a MOS structure. Explanation will be given of a case with such bi-polar transistors, with reference to FIG. 14 to FIG. 16.

Figure 14:
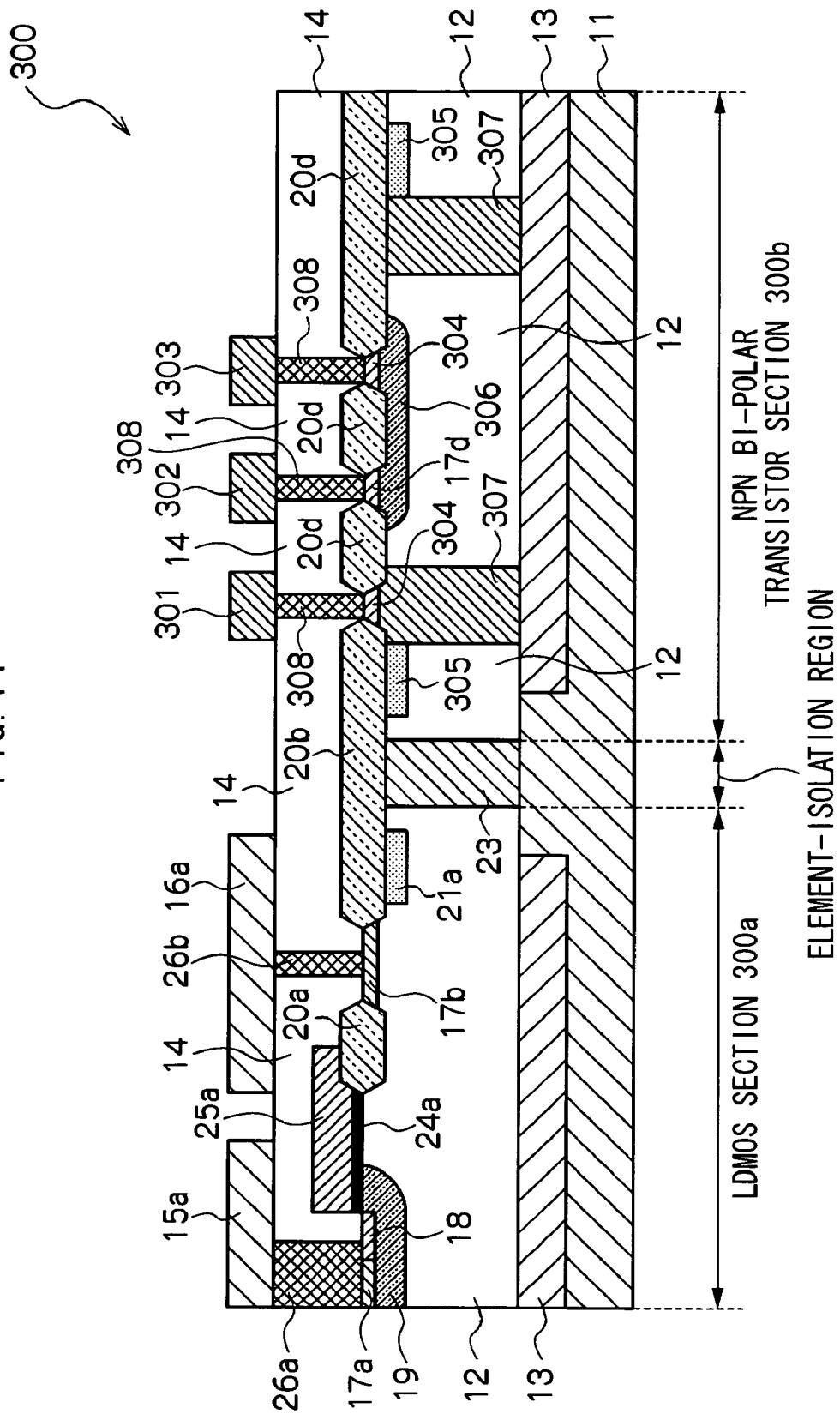
FIG. 14 is a cross-section of a portion of a semiconductor device according to an exemplary modification of an exemplary embodiment of the present invention.
Figure 15:
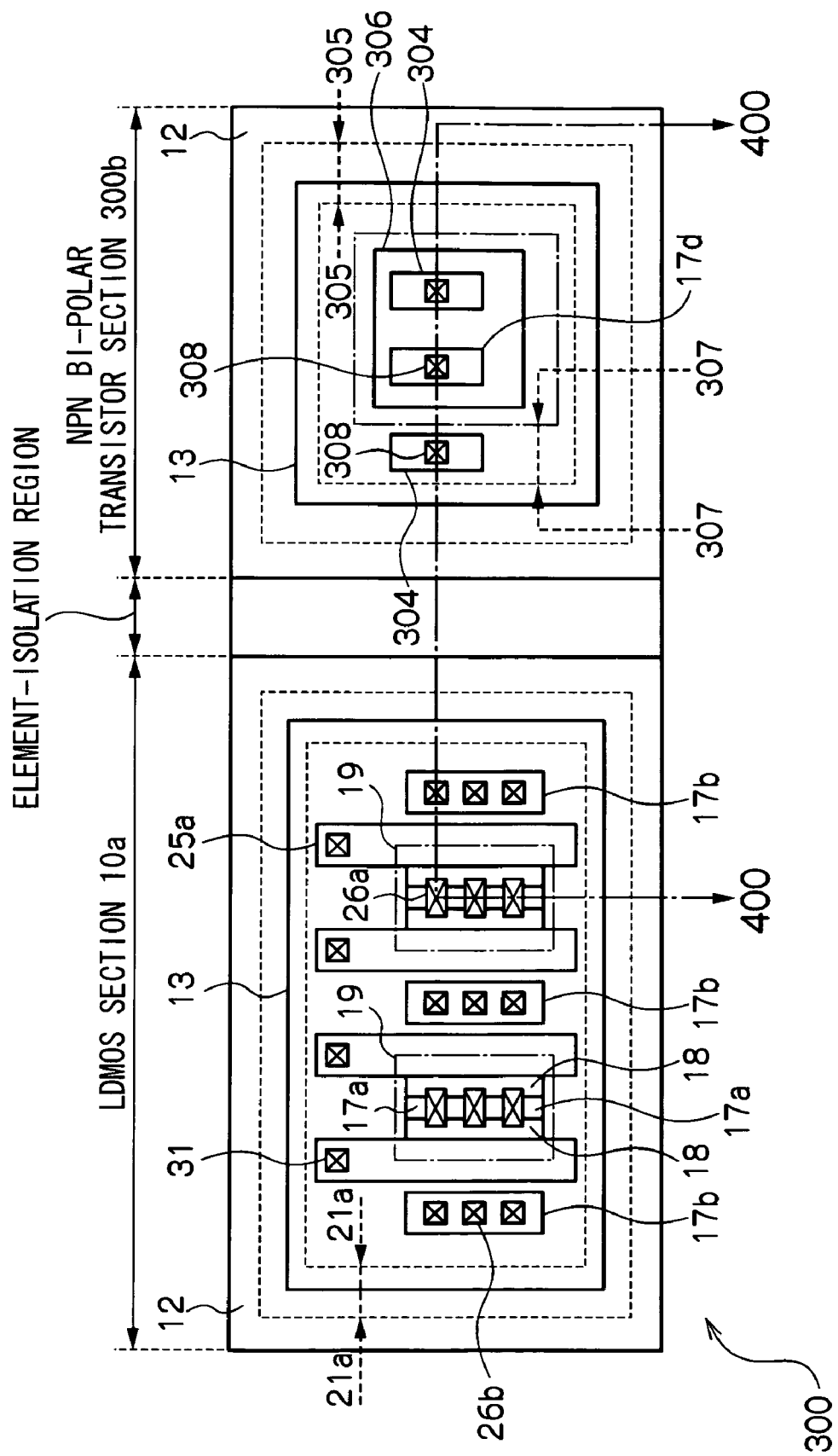
FIG. 15 is a plan view of a semiconductor device according to an exemplary modification of an exemplary embodiment of the present invention.
Figure 16:
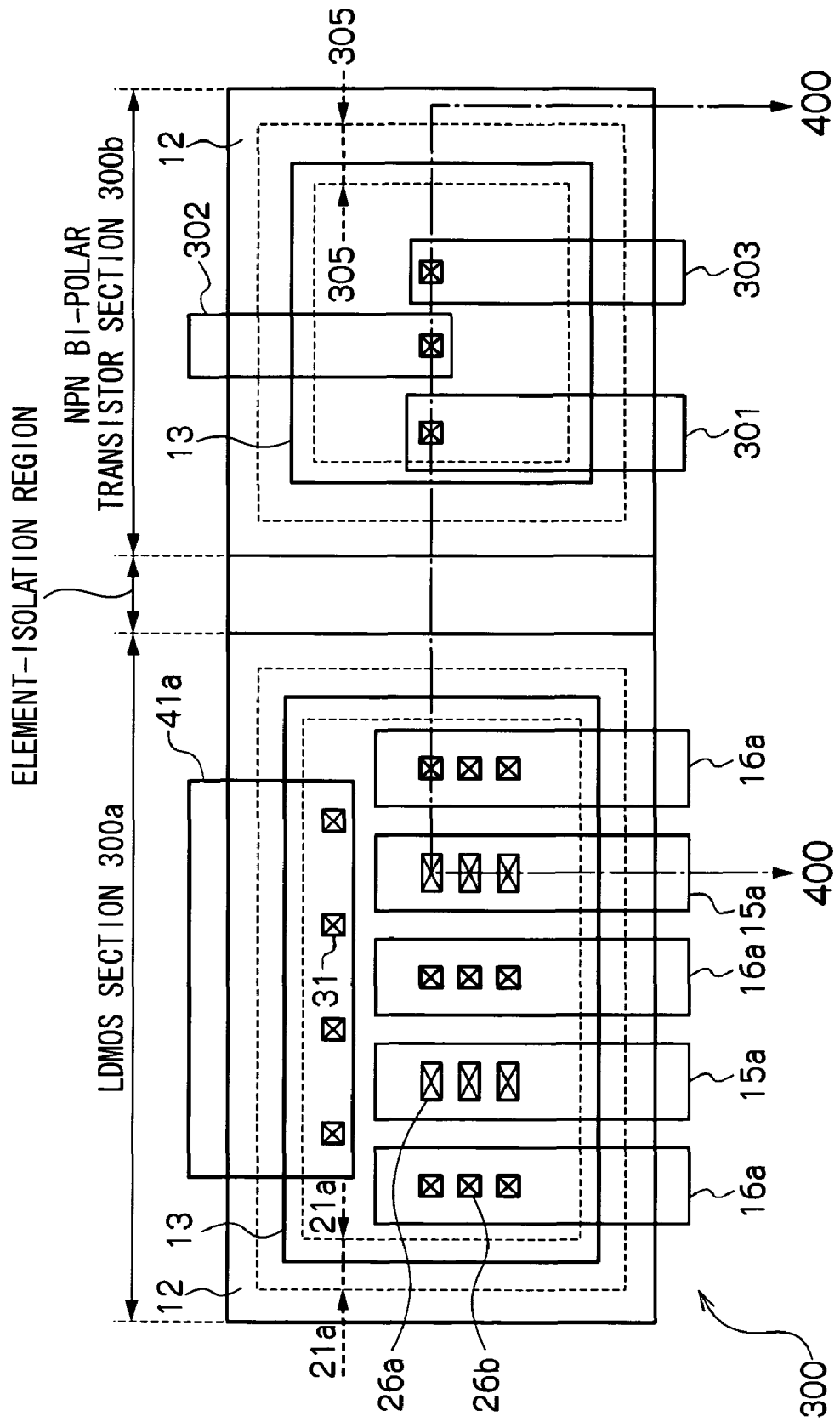
FIG. 16 is a plan view of a semiconductor device according to an exemplary modification of an exemplary embodiment of the present invention.

FIG. 14 is a cross-section of a portion of a semiconductor device 300 (a cross-section taken on line 400-400 in FIG. 15 and FIG. 16). As shown in FIG. 14, the semiconductor device 300 is segregated by a P-type element-isolation region, described later, into an LDMOS section 300a formed from a lateral diffusion MOS transistor (LDMOS: Lateral Diffusion Metal-Oxide-Semiconductor) and an NPN bi-polar transistor section 300b. The LDMOS section 300a is formed with the same composition as the LDMOS section 10a described above, and so the same reference numerals are allocated thereto and explanation thereof is omitted.

As shown in FIG. 14, the NPN bi-polar transistor section 300b of the semiconductor device 300 is configured with: a P-type semiconductor substrate 11; an N-type epitaxial layer 12 formed above the P-type semiconductor substrate 11; an N-type buried layer 13 formed at the interface of the P-type semiconductor substrate 11 and the N-type epitaxial layer 12; a inter-layer insulating layer 14 formed above the N-type epitaxial layer 12; and a collector electrode 301, a base electrode 302, and an emitter electrode 303 formed on the inter-layer insulating layer 14.

A fourth high concentration P-type region 17d (referred to below simply as P$^+$ region 17d), a fourth N-type high concentration region 304 (referred to below simply as N$^+$ region 304), a fourth field oxide film 20d, a bi-polar channel stopper 305 which is fifth N-type high concentration regions, a P-type base region 306 and an N-type lifting layer 307 which is a sixth N-type high concentration region, are formed on the surface of the N-type epitaxial layer 12 of the NPN bi-polar transistor section 300b.

Contact lines 308 are formed for electrically connecting the P$^+$ region 17d and the N$^+$ region 304 in the inter-layer insulating layer 14 of the NPN bi-polar transistor section 300b. Each of the contact lines 308 is connected to one or other of the collector electrode 301, the base electrode 302 or the emitter electrode 303.

Explanation will now be given of the structure in plan view of the semiconductor device 300, with reference to FIG. 15 and FIG. 16. FIG. 15 is a diagram showing the layout of each of the impurity regions and each of the contact lines in the semiconductor device 300, represented in plan view. FIG. 16 is a diagram showing in plan view each of the types of electrode formed on the surface of the semiconductor device 300 and each of the contact lines contacted thereto.

As shown in FIG. 15, the rectangular shaped P$^+$ region 17d is formed at a central portion of the NPN bi-polar transistor section 300b. The contact lines 308 are connected to the P$^+$ region 17d, so as to be electrically connectable to the portions external to the semiconductor device 300. Two of the rectangular shaped N$^+$ regions 304 are formed to the NPN bi-polar transistor section 300b, so that the P$^+$ region 17d is interposed therebetween. Contact lines 308 are connected to each of these two N$^+$ regions 304, so as to be electrically connectable to the portions external to the semiconductor device 300. The P-type base region 306 is formed so as to surround the P$^+$ region 17d and one of the N$^+$ regions 304. The N-type lifting layer 307 is formed in a ring shape so as to surround the P-type base region 306. The bi-polar channel stopper 305 is also formed in a ring shape so as to surround the N-type lifting layer 307. Charge leakage and the like does not occur due to the above shape of the bi-polar channel stopper 305. The bi-polar channel stopper 305 may be configured with a portion thereof cut away as long as there is no charge leakage or the like (i.e. a structure having a non-continuous portion).

As shown in FIG. 15 and FIG. 16, the contact line 308 that is connected to the P$^+$ region 17d of the NPN bi-polar transistor section 300b is connected to the base electrode 302 formed above the inter-layer insulating layer 14. One of the contact lines 308 connected to the N+ regions 304 of the NPN bi-polar transistor section 300b is connected to the collector electrode 301 formed above the inter-layer insulating layer 14, and another is connected to the emitter electrode 303.

The above semiconductor device 300 with the NPN bi-polar transistor section 300b also is provided with the bi-polar channel stopper 305 separated by a specific separation distance from the P-type isolation region 23. A high isolation breakdown voltage is thereby obtained.

EXPLANATION OF THE REFERENCE NUMERALS 10 semiconductor device
11 P-type semiconductor substrate
12 N-type epitaxial layer
13 N-type buried layer
14 inter-layer insulating layer
15a LDMOS source electrode
15b HVMOS source electrode
16a LDMOS drain electrode
16b HVMOS drain electrode
17a to 17d high concentration P-type regions (P+ region)
18 first N-type high concentration region (N+ region)
19 P-type body layer
20a to 20d first field oxide film
21a second N-type high concentration region (LDMOS channel stopper)
21b third N-type high concentration region (HVMOS channel stopper)
22 P-type drift layer
23 P-type isolation region
24a LDMOS gate oxidation film
24b HVMOS gate oxidation film
25a LDMOS gate electrode
25b HVMOS gate line
26a to 26c contact lines

What is claimed is:

1. A semiconductor device comprising:
a first conduction type semiconductor layer;
a second conduction type element forming region formed above the first conduction type semiconductor layer and formed with at least one semiconductor element formed on a surface region of the second conduction type element forming region;
a first conduction type element-isolation region that insulates and segregates the second conduction type element forming region from the exterior;
a second conduction type buried region formed at the interface of the first conduction type semiconductor layer and the second conduction type element forming region, separated from the first conduction type element-isolation region; and
a second conduction type high concentration region buried in a surface of the second conduction type element forming region and also formed to surround the semiconductor element and separated from the first conduction type element-isolation region; wherein
when viewed from a direction orthogonal to a surface plane of the first conduction type semiconductor layer, an end portion at the first conduction type element-isolation region side of the second conduction type high concentration region extends into a region between the second conduction type buried region and the first conduction type element-isolation region.

2. The semiconductor device of claim 1, wherein the separation distance from the first conduction type element-isolation region to the second conduction type high concentration region is 20% to 60% of the separation distance from the first conduction type element-isolation region to the second conduction type buried region.

3. The semiconductor device of claim 1, wherein the separation distance from the first conduction type element-isolation region to the second conduction type high concentration region is 30% to 40% of the separation distance from the first conduction type element-isolation region to the second conduction type buried region.

4. The semiconductor device of claim 1, wherein at least one portion of the second conduction type high concentration region faces the second conduction type buried region.

5. The semiconductor device of claim 1, wherein the separation distance from the first conduction type element-isolation region to the second conduction type high concentration region is 3 µm or less, and the separation distance from the first conduction type element-isolation region to the second conduction type buried region is 5 µm or less.

6. The semiconductor device of claim 1, wherein the second conduction type high concentration region surrounds the semiconductor element in a ring shape.

7. The semiconductor device of claim 1, wherein the second conduction type high concentration region does not make contact with the semiconductor element.

8. The semiconductor device of claim 1, wherein a field oxide film is formed above the first conduction type element-isolation region.

9. A semiconductor device on which a plurality of element regions for forming semiconductor elements are consolidated so as to be electrically isolated from each other by a first conduction type element-isolation region, wherein:
each of the element regions comprises a first conduction type semiconductor layer, a second conduction type element forming region, and a second conduction type buried layer interposed between the first conduction type semiconductor layer and the second conduction type element forming region; and
in the second conduction type element forming region, by forming a second conduction type high concentration region buried in the surface of the second conduction type element forming region so as to be separated from the first conduction type element-isolation region and so as to surround the semiconductor element, adjacent element regions have a higher isolation breakdown voltage in comparison to a case where the second conduction type high concentration region is not provided; wherein
when viewed from a direction orthogonal to a surface plane of the first conduction type semiconductor layer, an end portion at the first conduction type element-isolation region side of the second conduction type high concentration region extends into a region between the second conduction type buried layer and the first conduction type element-isolation region.

10. A semiconductor device comprising:
a first conduction type semiconductor layer;
a second conduction type element forming region formed above the first conduction type semiconductor layer and formed with at least one semiconductor element formed on a surface region of the second conduction type element forming region;
a first conduction type element-isolation region that insulates and segregates the second conduction type element forming region from the exterior;

a second conduction type buried region formed at the interface of the first conduction type semiconductor layer and the second conduction type element forming region, separated from the first conduction type element-isolation region; and a second conduction type high concentration region buried in a surface of the second conduction type element forming region and also formed to surround the semiconductor element and separated from the first conduction type element-isolation region; wherein the horizontal separation distance from a vertical plane contacting the edge of the first conduction type element-isolation region to the second conduction type high concentration region is less than the horizontal separation distance from the vertical plane contacting the edge of the first conduction type element-isolation region to the second conduction type buried region.

11. A semiconductor device comprising:

a first conduction type semiconductor layer;

a second conduction type element forming region formed above the first conduction type semiconductor layer and formed with at least one semiconductor element formed on a surface region of the second conduction type element forming region;

a first conduction type element-isolation region that insulates and segregates the second conduction type element forming region from the exterior;

a second conduction type buried region formed at the interface of the first conduction type semiconductor layer and the second conduction type element forming region, separated from the first conduction type element-isolation region; and a second conduction type high concentration region buried in a surface of the second conduction type element forming region and also formed to surround the semiconductor element and separated from the first conduction type element-isolation region, wherein, an end portion at the first conduction type element-isolation region side of the second conduction type high concentration region extends into a region bounded between a plane contacting the edge of the second conduction type buried region and a plane contacting the edge of the first conduction type element-isolation region.

\* \* \* \* \*